United States Patent
Yang et al.

(10) Patent No.: US 11,705,175 B2
(45) Date of Patent: Jul. 18, 2023

(54) SHARED DECODER CIRCUIT AND METHOD

(71) Applicants: TAIWAN SEMICONDUCTOR MANUFACTURING COMPANY, LTD., Hsinchu (TW); TSMC CHINA COMPANY, LIMITED, Shanghai (CN); TSMC NANJING COMPANY, LIMITED, Nanjing (CN)

(72) Inventors: XiuLi Yang, Hsinchu (TW); Ching-Wei Wu, Hsinchu (TW); He-Zhou Wan, Hsinchu (TW); Kuan Cheng, Hsinchu (TW); Luping Kong, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN); TSMC CHINA COMPANY, LIMITED, Songjiang (CN)

( * ) Notice: Subject to any disclaimer, the term of this patent is extended or adjusted under 35 U.S.C. 154(b) by 0 days.

(21) Appl. No.: 17/883,364

(22) Filed: Aug. 8, 2022

(65) Prior Publication Data
US 2022/0375512 A1 Nov. 24, 2022

Related U.S. Application Data

(63) Continuation of application No. 17/183,005, filed on Feb. 23, 2021, now Pat. No. 11,450,367, which is a
(Continued)

(30) Foreign Application Priority Data
Aug. 29, 2019 (CN) .......................... 201910808044.X

(51) Int. Cl.
*G11C 8/18* (2006.01)
*G11C 7/10* (2006.01)
(Continued)

(52) U.S. Cl.
CPC ................ *G11C 8/18* (2013.01); *G11C 7/106* (2013.01); *G11C 7/109* (2013.01); *G11C 7/1063* (2013.01);
(Continued)

(58) Field of Classification Search
CPC ..... G11C 16/30; G11C 16/32; G11C 11/5621; G11C 11/5671; G11C 16/0483; H02M 3/07
(Continued)

(56) References Cited

U.S. PATENT DOCUMENTS

| 4,694,395 A | 9/1987 | Young et al. |
| 5,268,865 A | 12/1993 | Takasugi |

(Continued)

FOREIGN PATENT DOCUMENTS

| KR | 20190040078 | 4/2019 |
| TW | 473733 | 1/2002 |

OTHER PUBLICATIONS

Office Action dated Apr. 22, 2020 from corresponding application No. DE 10 2019 128 331.0.
(Continued)

*Primary Examiner* — Michael T Tran
(74) *Attorney, Agent, or Firm* — Hauptman Ham, LLP

(57) ABSTRACT

A circuit includes a plurality of registers, each register including SRAM cells, a read port configured to receive a read address, a write port configured to receive a write address, a selection circuit, a latch circuit, and a decoder coupled in series between the read and write ports and the plurality of registers, and a control circuit. Responsive to a
(Continued)

clock signal and read and write enable signals, the control circuit causes the selection circuit, the latch circuit, and the decoder to select a first register of the plurality of registers in a read operation based on the read address, and select a second register of the plurality of registers in a write operation based on the write address.

20 Claims, 9 Drawing Sheets

Related U.S. Application Data continuation of application No. 16/582,514, filed on Sep. 25, 2019, now Pat. No. 10,937,477.

(51) Int. Cl.
| | |
|---|---|
| *G11C 7/22* | (2006.01) |
| *G11C 8/08* | (2006.01) |
| *G11C 8/10* | (2006.01) |
| *G11C 11/418* | (2006.01) |
| *G11C 11/419* | (2006.01) |

(52) U.S. Cl.
CPC ............ *G11C 7/1087* (2013.01); *G11C 7/222* (2013.01); *G11C 8/08* (2013.01); *G11C 8/10* (2013.01); *G11C 11/418* (2013.01); *G11C 11/419* (2013.01)

(58) Field of Classification Search
USPC ........................................ 365/189.05, 230.06
See application file for complete search history.

(56) References Cited

U.S. PATENT DOCUMENTS

| | | | |
|---|---|---|---|
| 5,339,276 A | 8/1994 | Takasugi | |
| 5,528,552 A | 6/1996 | Kamisaki | |
| 5,544,121 A | 8/1996 | Dosaka et al. | |
| 5,548,557 A | 8/1996 | Futatsuya et al. | |
| 5,652,725 A | 7/1997 | Suma et al. | |
| 5,925,142 A | 7/1999 | Raad et al. | |
| 6,044,429 A | 3/2000 | Ryan et al. | |
| 6,115,823 A | 9/2000 | Velasco et al. | |
| 6,175,891 B1 | 1/2001 | Norman et al. | |
| 6,317,819 B1 * | 11/2001 | Morton | G06F 9/3012 |
| | | | 711/E12.051 |
| 6,421,286 B1 | 7/2002 | Ohtani et al. | |
| 6,700,822 B1 | 3/2004 | Wang | |
| 6,735,126 B1 | 5/2004 | Nakagawa | |
| 6,938,141 B2 | 8/2005 | Wu | |
| 6,975,547 B2 | 12/2005 | Byeon et al. | |
| 6,981,126 B1 | 12/2005 | Blodgett | |
| 7,035,154 B2 | 4/2006 | Takahashi et al. | |
| 7,162,003 B2 | 1/2007 | Vergnes et al. | |
| 7,206,251 B1 * | 4/2007 | Yu | G11C 11/419 |
| | | | 365/189.16 |
| 7,466,621 B2 | 12/2008 | Lee | |
| 7,643,330 B1 | 1/2010 | Lin et al. | |
| 8,837,250 B2 | 9/2014 | Xiao et al. | |
| 9,490,006 B2 | 11/2016 | Yang et al. | |
| 10,303,629 B2 * | 5/2019 | Shu | H01L 21/76838 |
| 10,365,681 B1 * | 7/2019 | Stark | G06F 12/0862 |
| 11,068,408 B2 * | 7/2021 | Kim | G11C 29/52 |
| 2002/0071328 A1 | 6/2002 | Fujimoto et al. | |
| 2003/0031073 A1 | 2/2003 | Yahata et al. | |
| 2003/0043628 A1 | 3/2003 | Lee | |
| 2003/0112668 A1 | 6/2003 | Takahashi et al. | |
| 2004/0170081 A1 | 9/2004 | Takahashi et al. | |
| 2005/0105380 A1 | 5/2005 | Takahashi et al. | |
| 2005/0122795 A1 | 6/2005 | Fujisawa et al. | |
| 2005/0185481 A1 | 8/2005 | Oka | |
| 2006/0203550 A1 | 9/2006 | Lee | |
| 2007/0189075 A1 | 8/2007 | Ausserlechner et al. | |
| 2009/0196103 A1 | 8/2009 | Kim | |
| 2009/0316508 A1 | 12/2009 | Inaba | |
| 2010/0061156 A1 | 3/2010 | Sunaga et al. | |
| 2011/0085399 A1 | 4/2011 | Chen et al. | |
| 2012/0265951 A1 | 10/2012 | Lin et al. | |
| 2012/0274353 A1 * | 11/2012 | Pedersen | G06F 21/79 |
| | | | 365/189.08 |
| 2012/0324174 A1 * | 12/2012 | Damodaran | G06F 5/06 |
| | | | 711/E12.001 |
| 2013/0077427 A1 | 3/2013 | Kondo | |
| 2013/0103869 A1 | 4/2013 | Koido | |
| 2013/0275817 A1 * | 10/2013 | Bancel | G06F 11/0751 |
| | | | 714/54 |
| 2014/0153349 A1 | 6/2014 | Wu et al. | |
| 2014/0369150 A1 | 12/2014 | Shin | |
| 2014/0376323 A1 | 12/2014 | Terada | |
| 2015/0092475 A1 | 4/2015 | Sachan et al. | |
| 2016/0322109 A1 | 11/2016 | Kim | |
| 2016/0358637 A1 | 12/2016 | Bu et al. | |
| 2017/0358344 A1 * | 12/2017 | Ishii | G11C 8/18 |
| 2018/0166128 A1 | 6/2018 | Rawat et al. | |
| 2018/0225124 A1 * | 8/2018 | Gupta | G06F 9/3891 |
| 2018/0349222 A1 | 12/2018 | Hashizume et al. | |
| 2019/0108876 A1 | 4/2019 | Ishii et al. | |
| 2019/0332313 A1 * | 10/2019 | Xu | G06F 3/0604 |
| 2019/0348107 A1 | 11/2019 | Shin et al. | |
| 2019/0371380 A1 | 12/2019 | Vancha et al. | |
| 2020/0066325 A1 | 2/2020 | Kang et al. | |
| 2020/0082854 A1 | 3/2020 | Kim | |
| 2020/0372956 A1 | 11/2020 | Nam et al. | |
| 2020/0381051 A1 | 12/2020 | Her et al. | |

OTHER PUBLICATIONS

Office Action dated Oct. 23, 2020 for corresponding case No. KR 10-2019-0157759 (pp. 1-6).

Office Action dated May 6, 2021 for corresponding case No. TW 11020426990. (pp. 1-6).

Notice of Allowance dated May 11, 2021 for corresponding casee No. KR 10-2019-0157759, English translation attached on p. 1. (pp. 1-6).

* cited by examiner

SHARED DECODER CIRCUIT AND METHOD

PRIORITY CLAIM

The present application is a continuation of U.S. application Ser. No. 17/183,005, filed Feb. 23, 2021, which is a continuation of U.S. application Ser. No. 16/582,514, filed Sep. 25, 2019, now U.S. Pat. No. 10,937,477, issued Mar. 2, 2021, which claims the priority of China Patent Application No. 201910808044.X, filed Aug. 29, 2019, each of which is incorporated herein by reference in its entirety.

BACKGROUND

Memory arrays are often used to store and access data used for various types of computations such as logic or mathematical operations. To perform these operations, data are moved through data ports between the memory arrays and circuits used to perform the computations. In some cases, the number of data lines in a memory array through which stored data are accessed is less than the number of data ports, and some or all of the data lines are shared for data movement operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
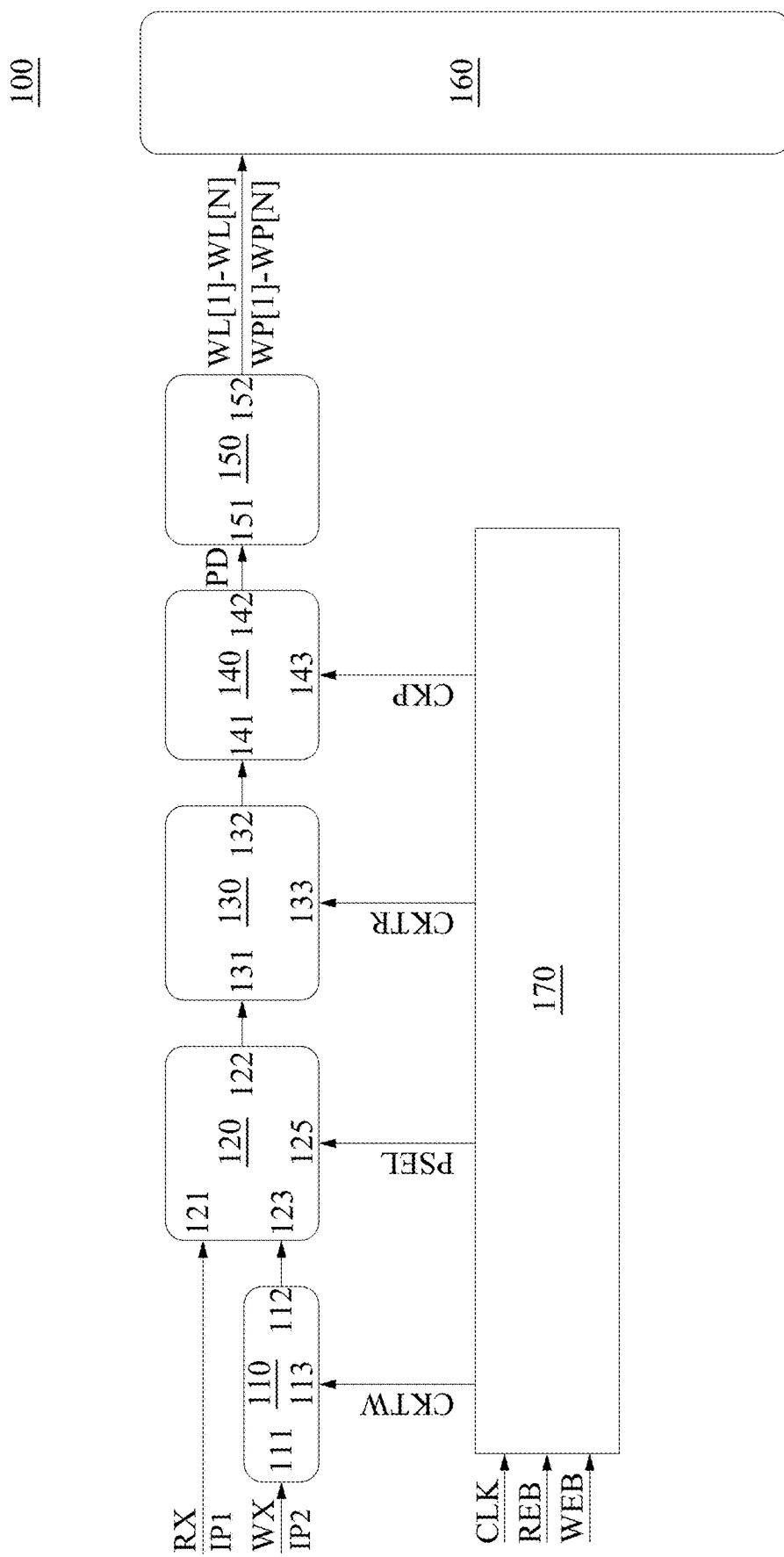
FIG. 1 is a diagram of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a circuit includes a single decoder and a selection circuit and is configured to select and decode one of two addresses corresponding to data movement, e.g., read and write, operations in a memory array. By using a single decoder to activate control lines during the data movement operations, area requirements are reduced compared to approaches in which separate decoders are used for each of two addresses in memory array data movement operations.

FIG. 1 is a diagram of a memory circuit 100, in accordance with some embodiments. Memory circuit 100, also referred to as circuit 100, includes a latch circuit 110, a selection circuit 120, a latch circuit 130, a pre-decoder 140, a decoder 150, a memory array 160, and a control circuit 170. As discussed below, control circuit 170 includes a signal generation portion, also referred to as a double pump generator in some embodiments, configured to generate various timing signals, and a clock buffer portion configured to output various control signals based on the timing signals.

Memory circuit 100 is configured as discussed below to receive an address RX from a port IP1, an address WX from a port IP2, a clock signal CLK, and enable signals REB and WEB, and, in response to clock signal CLK and enable signals REB and WEB, select and decode one of addresses RX or WX, thereby generating one or more of a number N of word line signals WL[1]-WL[N] on a corresponding one or more of word line signal paths WP[1]-WP[N].

In some embodiments, memory array 160 is a static random access memory (SRAM) array including single-port memory cells, and memory circuit 100 is configured to facilitate data movement in and out of single-port memory cells identified by addresses RX and WX. In some embodiments, memory circuit 100 is configured to facilitate data movement in and out of single-port memory cells at column locations, also referred to as X locations, identified by addresses RX and WX. In some embodiments, addresses RX and WX are derived from corresponding addresses (not shown) that include additional information, e.g., column identifiers, and addresses RX and WX do not include the additional information.

In some embodiments, memory array 160 includes a register file of processor registers including single-port memory cells, and memory circuit 100 is configured to control data movement in pseudo two-port register file (2PRF) operations. In pseudo 2PRF operations, in some embodiments, single-port memory cells are used to perform functions of two-port memory cells by using a single clock signal instead of two separate clock signals. A first half of a clock cycle of the single clock signal is used to control a read operation based on a read address received on a read port, and a second half of the clock cycle is used to control a write operation based on a write address received on a write port. In some embodiments, memory circuit 100 is included in an ultra-high density (UHD) pseudo 2PRF circuit. In some embodiments, memory circuit 100 is an integrated circuit (IC).

In the embodiment depicted in FIG. 1, memory circuit 100 includes memory array 160 coupled to decoder 150 through word line signal paths WP[1]-WP[N]. In various embodiments, memory circuit 100 includes word line signal paths WP[1]-WP[N] and does not include memory array 160, or includes neither memory array 160 nor word line signal paths WP[1]-WP[N].

Latch circuit 110 is coupled to port IP2, selection circuit 120, and control circuit 170; selection circuit 120 is coupled to port IP1, each of latch circuits 110 and 130, and control circuit 170; latch circuit 130 is coupled to selection circuit 120, pre-decoder 140, and control circuit 170; pre-decoder 140 is coupled to latch circuit 130, decoder 150, and control circuit 170; and decoder 150 is coupled to pre-decoder 140 and memory array 160.

Two or more circuit elements are considered to be coupled based on one or more direct signal connections and/or one or more indirect signal connections that include one or more logic devices, e.g., an inverter or logic gate, between the two or more circuit elements. In some embodiments, signal communications between the two or more coupled circuit elements are capable of being modified, e.g., inverted or made conditional, by the one or more logic devices.

Each of addresses RX and WX includes a combination of logical states configured to identify one or more physical locations in a memory array, e.g., memory array 160, corresponding to a given word. In some embodiments, each word corresponds to a row of memory array 160, address RX is configured to identify a corresponding row of memory array 160 in a read operation, and address WX is configured to identify a corresponding row of memory array 160 in a write operation.

An address RX or WX includes a number L of logical states corresponding to $2^L$ words in some or all of a memory, e.g., memory array 160. In some embodiments, L is a number of logical states ranging from two logical states corresponding to four words, to 12 logical states corresponding to 4096 words. In some embodiments, an address RX or WX includes L equal to four logical states corresponding to 16 words. In some embodiments, the $2^L$ words corresponding to the L logical states in addresses RX and WX is equal to the number N of word line signal paths WP[1]-WP[N].

In the embodiment depicted in FIG. 1, each of ports IP1 and IP2, latch circuits 110 and 130, selection circuit 120, and pre-decoder 140 includes one or more electrical paths configured to conduct one or more signals corresponding to the L logical states included in addresses RX and WX. In some embodiments, each of ports IP1 and IP2, latch circuits 110 and 130, selection circuit 120, and pre-decoder 140 includes a number of electrical paths equal to L.

In various embodiments, at least one of latch circuits 110 or 130 is one latch circuit of a plurality of latch circuits (not shown) and/or selection circuit 120 is one selection circuit of a plurality of selection circuits (not shown), the at least one plurality of latch circuits and/or selection circuits being configured to collectively conduct the one or more signals corresponding to the L logical states included in addresses RX and WX. In some embodiments, each of latch circuits 110 and 130 includes a single electrical path and is one latch circuit of the number L of latch circuits, selection circuit 120 includes a single electrical path and is one selection circuit of the number L of selection circuits, and circuit 100 is thereby configured to collectively conduct the one or more signals corresponding to the L logical states included in addresses RX and WX.

Latch circuit 110 is an electronic circuit that includes an input 111 configured to receive address WX from port IP2, an input 113 configured to receive a clock pulse signal CKTW from control circuit 170, and an output 112 configured to output address WX, selectively latched responsive to clock pulse signal CKTW.

Selection circuit 120 is an electronic circuit that includes an input 121 configured to receive address RX from port IP1, an input 123 configured to receive address WX from output 112 of latch circuit 110, an input 125 configured to receive a select signal PSEL from control circuit 170, and an output 122 configured to output either of addresses RX or WX responsive to select signal PSEL. Selection circuit 120 is thereby configured to pass the selected address RX or WX to output 122. In some embodiments, selection circuit 120 includes a multiplexer.

Latch circuit 130 is an electronic circuit that includes an input 131 configured to receive either of addresses RX or WX from output 122 of selection circuit 120, an input 133 configured to receive a clock pulse signal CKTR from control circuit 170, and an output 132 configured to output the received address RX or WX, selectively latched responsive to clock pulse signal CKTR.

Pre-decoder 140 is a combinational logic circuit that includes an input 141 configured to receive either of addresses RX or WX from output 132 of latch circuit 130, an input 143 configured to receive a clock pulse signal CKP from control circuit 170, and an output 142 configured to output a partially decoded address PD based on the received address RX or WX, selectively enabled responsive to clock pulse signal CKP.

Decoder 150 is a combinational logic circuit that includes an input 151 configured to receive partially decoded address PD from output 142 of pre-decoder 140, and an output 152 configured to output one or more of word line signals WL[1]-WL[N] on a corresponding one or more of word line signal paths WP[1]-WP[N] based on partially decoded address PD.

In the embodiment depicted in FIG. 1, pre-decoder 140 and decoder 150 are separate circuits. In some embodiments, pre-decoder 140 and decoder 150 are a single combinational logic circuit configured to output one or more of word line signals WL[1]-WL[N] on a corresponding one or more of word line signal paths WP[1]-WP[N] based on address RX or WX received on input 141 from output 132 of latch circuit 130, selectively enabled responsive to clock pulse signal CKP.

In some embodiments, memory circuit 100 does not include decoder 150, output 142 of pre-decoder 140 is an output of memory circuit 100, and pre-decoder 140 is configured to output partially decoded address PD as one or more output signals of memory circuit 100.

Memory array 160 is an array of memory cells (not shown) arranged in rows and columns. A memory cell of memory array 160 includes electrical, electromechanical, electromagnetic, or other devices configured to store bit data represented by logical states. In some embodiments, a logical state corresponds to a voltage level of an electrical charge stored in a given memory cell. In some embodiments, a logical state corresponds to a physical property, e.g., a resistance or magnetic orientation, of a component of a given memory cell.

In some embodiments, the memory cells of memory array 160 include SRAM cells. In various embodiments, SRAM cells include five-transistor (5T) SRAM cells, six-transistor (6T) SRAM cells, eight-transistor (8T) SRAM cells, nine-transistor (9T) SRAM cells, or SRAM cells having other numbers of transistors. In some embodiments, the memory cells of memory array 160 include dynamic random-access memory (DRAM) cells or other memory cell types capable of storing bit data.

Some or all of the memory cells of a given row or column of memory array 160 are configured to be activated simultaneously in read and write operations as a word, responsive to a corresponding one or more of word line signals WL[1]-WL[N] received from a corresponding one or more of word line signal paths WP[1]-WP[N]. In some embodiments, each word corresponds to a row of memory cells in memory array 160, and each one of word line signal paths WP[1]-WP[N] is coupled to the memory cells in the row corresponding to a given word.

Addresses RX and WX, clock pulse signals CKTW, CKTR, and CKP, select signal PSEL, word line signals WL[1]-WL[N], and other signals used by memory circuit 100 discussed below, are configured to have one or more voltage levels corresponding to logical states. A high logical state corresponds to a voltage level at or above a first predetermined threshold, and a low logical state corresponds to a voltage level at or below a second predetermined threshold. In various embodiments, the first predetermined threshold corresponds to a voltage level at or near an operating voltage level, e.g., a voltage level VDD or VDDM, of memory circuit 100, and/or the second predetermined threshold corresponds to a voltage level at or near a reference voltage level, e.g., a voltage level VSS or ground, of memory circuit 100.

In various embodiments, latch circuit 110 is configured to latch address WX in response to clock pulse signal CKTW having a predetermined one of the high or low logical states, selection circuit 120 is configured to pass a given one of address RX or WX to output 122 in response to select signal PSEL having a corresponding one of the high or low logical states, latch circuit 130 is configured to latch address RX or WX in response to clock pulse signal CKTR having a predetermined one of the high or low logical states, and pre-decoder 140 is configured to output partially decoded address PD in response to clock pulse signal having a predetermined one of the high or low logical states.

In various embodiments, decoder 150 is configured to activate a given one or more of word line signal paths WP[1]-WP[N], and thereby the corresponding word, by outputting the one or more word line signals WL[1]-WL[N] having a predetermined one of the high or low logical states. Outputting a given one of word line signals WL[1]-WL[N] having the predetermined one of the high or low logical states is also referred to as activating the given one of word line signals WL[1]-WL[N], and outputting the given one of word line signals WL[1]-WL[N] having the other of the high or low logical states is referred to as deactivating the given one of word line signals WL[1]-WL[N], in some embodiments.

Control circuit 170 is an electronic circuit configured to receive clock signal CLK and enable signals REB and WEB, and generate clock pulse signals CKTW, CKTR, and CKP, and select signal PSEL based on clock signal CLK and enable signals REB and WEB. Control circuit 170 is configured to control operating parameters of memory circuit 100, thereby generating clock pulse signals CKTW, CKTR, and CKP and select signal PSEL having timing relationships as discussed below with respect to FIGS. 2A and 2B. In some embodiments, control circuit 170 includes a control circuit 300 discussed below with respect to FIG. 3.

Figure 2A:
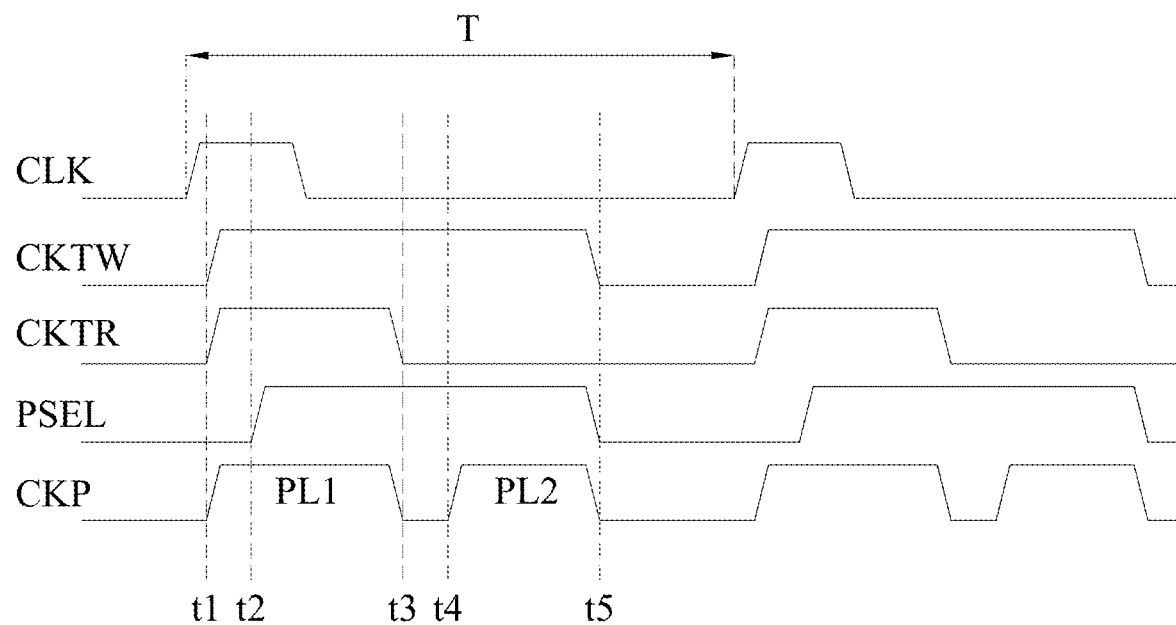
FIGS. 2A and 2B are plots of memory circuit operating parameters, in accordance with some embodiments.

FIG. 2A is a plot of memory circuit 100 operating parameters, in accordance with some embodiments. In the non-limiting example depicted in FIG. 2A, signals CLK, CKTW, CKTR, PSEL, and CKP include transitions between the high and low logical states corresponding to memory circuit 100 operation at times t1-t5 as discussed below. FIG. 2A depicts a case in which each of enable signals REB and WEB has a logical state corresponding to an enabled state and is not shown for the purpose of clarity.

In the embodiment depicted in FIG. 2A, each of latch circuits 110 and 130 is configured to, in response to the corresponding clock pulse signal transitioning to the high logical state, latch the received address and pass the latched address to the corresponding output until the corresponding clock pulse signal transitions to the low logical state, and in response to the corresponding clock pulse signal having the low logical state, pass the received address to the corresponding output without performing the latching operation. Selection circuit 120 is configured to pass each of addresses RX and WX to output 122 in response to select signal PSEL having respective low and high logical states, and pre-decoder 140 is configured to selectively output partially decoded address PD in response to clock pulse signal CKP having the high logical state.

In various embodiments, memory circuit 100 is configured to operate based on one or more of signals CLK, CKTW, CKTR, PSEL, or CKP having one or more logical states and/or transitions other than those depicted in FIG. 2A.

Clock signal CLK is generated by a circuit external to memory circuit 100 and includes a series of pulses having a predetermined period T. A rising edge of a pulse corresponds to a transition from the low logical state to the high logical state, and a falling edge of the pulse corresponds to a transition from the high logical state to the low logical state.

At time t1, control circuit 170 is configured to respond to a rising edge of clock signal CLK by generating a rising edge in each of clock pulse signals CKTW, CKTR, and CKP while select signal PSEL has the low logical state.

Based on the rising edge of clock pulse signal CKTW, latch circuit 110 latches address WX and passes latched address WX to output 112. Based on the low logical state of select signal PSEL, selection circuit 120 passes address RX to output 122. Based on the rising edge of clock pulse signal CKTR, latch circuit 130 latches address RX and passes latched address RX to output 122. Based on the rising edge of clock pulse signal CKP, pre-decoder 140 becomes enabled, thereby generating partially decoded address PD at output 142 based on latched address RX, and decoder 150 activates the word line signal of word line signals WL[1]-WL[N] corresponding to address RX, as discussed below with respect to FIG. 2B.

At time t2, subsequent to time t1, control circuit 170 is configured to generate a rising edge in select signal PSEL while each of clock pulse signals CKTW, CKTR, and CKP remains at the high logical state.

Because clock pulse signal CKTW remains at the high logical state, latch circuit 110 continues to pass latched address WX to output 112. Based on the rising edge of select signal PSEL, selection circuit 120 passes latched address WX to output 122. Because clock pulse signal CKTR remains at the high logical state, latch circuit 130 continues to pass latched address RX to output 132. Because clock pulse signal CKP remains at the high logical state, pre-decoder 140 remains enabled, thereby continuing to generate partially decoded address PD at output 142 based on latched address RX such that decoder 150 continues to activate the word line signal of word line signals WL[1]-WL[N] corresponding to address RX.

At time t3, subsequent to time t2, control circuit 170 is configured to generate a falling edge in each of clock pulse signals CKTR and CKP while each of clock pulse signal CKTW and select signal PSEL remains at the high logical state.

Because clock pulse signal CKTW remains at the high logical state, latch circuit 110 continues to pass latched address WX to output 112. Because select signal PSEL remains at the high logical state, selection circuit 120 continues to pass latched address WX to output 122. Based on the falling edge of clock pulse signal CKTR, latch circuit 130 ceases to latch address RX and passes latched address WX to output 122. Based on the falling edge of clock pulse signal CKP, pre-decoder 140 becomes disabled, thereby ceasing to generate partially decoded address PD at output 142 based on latched address RX, and decoder 150 deactivates the word line signal of word line signals WL[1]-WL[N] corresponding to address RX.

At time t4, subsequent to time t3, control circuit 170 is configured to generate a rising edge in clock pulse signal CKP while each of clock pulse signal CKTW and select signal PSEL remains at the high logical state and clock pulse signal CKTR remains at the low logical state.

Because clock pulse signal CKTW remains at the high logical state, latch circuit 110 continues to pass latched address WX to output 112. Because select signal PSEL remains at the high logical state, selection circuit 120 continues to pass latched address WX to output 122. Because clock pulse signal CKTR remains at the low logical state, latch circuit 130 continues to pass latched address WX to output 122. Based on the rising edge of clock pulse signal CKP, pre-decoder 140 becomes enabled, thereby generating partially decoded address PD at output 142 based on latched address WX, and decoder 150 activates the word lines signal of word line signals WL[1]-WL[N] corresponding to address WX, as discussed below with respect FIG. 2B.

At time t5, subsequent to time t4, control circuit 170 is configured to generate a falling edge in each of clock pulse signals CKTW and CKP and select signal PSEL while clock pulse signal CKTR remains at the low logical state.

Based on the falling edge of clock pulse signal CKTW, latch circuit 110 ceases to pass latched address WX to output 112. Based on the falling edge of select signal PSEL, selection circuit 120 passes address RX to output 122. Because clock pulse signal CKTR continues to have the low logical state, latch circuit 130 passes address RX to output 122. Based on the falling edge of clock pulse signal CKP, pre-decoder 140 becomes disabled, thereby ceasing to generate partially decoded address PD at output 142 based on latched address WX, and decoder 150 deactivates the word line signal of word line signals WL[1]-WL[N] corresponding to address WX.

The interval from times t1 to t3 corresponds to a pulse PL1 of clock pulse signal CPK during which decoder 150 activates the one of word line signals WL[1]-WL[N] based on latched address RX being passed to pre-decoder 140. In some embodiments, pulse PL1 corresponds to a read operation in memory array 160.

In the embodiment depicted in FIG. 2A, memory circuit 100 is configured to pass latched address RX to pre-decoder 140 during pulse PL1 by generating the rising edge of each of clock pulse signals CKTW, CKTR, and CKP at time t1 prior to generating the rising edge of select signal PSEL at time t2. In various embodiments, memory circuit 100 is configured to pass latched address RX to pre-decoder 140 during pulse PL1 by generating the rising edges of clock pulse signals CKTW, CKTR, and CKP having timings other than those depicted in FIG. 2A, such timings including causing latched address RX to be passed to pre-decoder 140 prior to generating the rising edge of select signal PSEL at time t2.

The interval from times t4 to t5 corresponds to a pulse PL2 of clock pulse signal CKP during which decoder 150 activates the one of word line signals WL[1]-WL[N] based on latched address WX being passed to pre-decoder 140. In some embodiments, pulse PL2 corresponds to a write operation in memory array 160.

In the embodiment depicted in FIG. 2A, memory circuit 100 is configured to pass latched address WX to pre-decoder 140 during pulse PL2 by generating the rising edge of clock pulse signal CKTW at time t1 and the rising edge of select signal PSEL at time t2 prior to generating the rising edge of pulse PL2 at time t4. In various embodiments, memory circuit 100 is configured to pass latched address WX to pre-decoder 140 during pulse PL2 by generating the rising edges of clock pulse signal CKTW and select signal PSEL having timings other than those depicted in FIG. 2A, such timings including causing latched address WX to be passed to pre-decoder 140 prior to or simultaneously with generating the rising edge of clock pulse signal CKP at time t4.

As indicated above, FIG. 2A depicts a case in which each of enable signals REB and WEB has a logical state corresponding to an enabled state. In some embodiments, memory circuit 100 is configured to respond to a case in which enable signal REB has a logical state corresponding to a disabled state by generating clock pulse signal CKP without pulse PL1 and/or to respond to a case in which enable signal WEB has a logical state corresponding to a disabled state by generating clock pulse signal CKP without pulse PL2.

As depicted in the non-limiting example of FIG. 2A, memory circuit 100 is configured to generate pulses PL1 and PL2 in the interval from times t1 to t5 less than period T of clock signal CLK. Memory circuit 100 is thereby capable of enabling a read operation and a write operation in memory array 160 during a single period T of clock signal CLK.

Figure 2B:
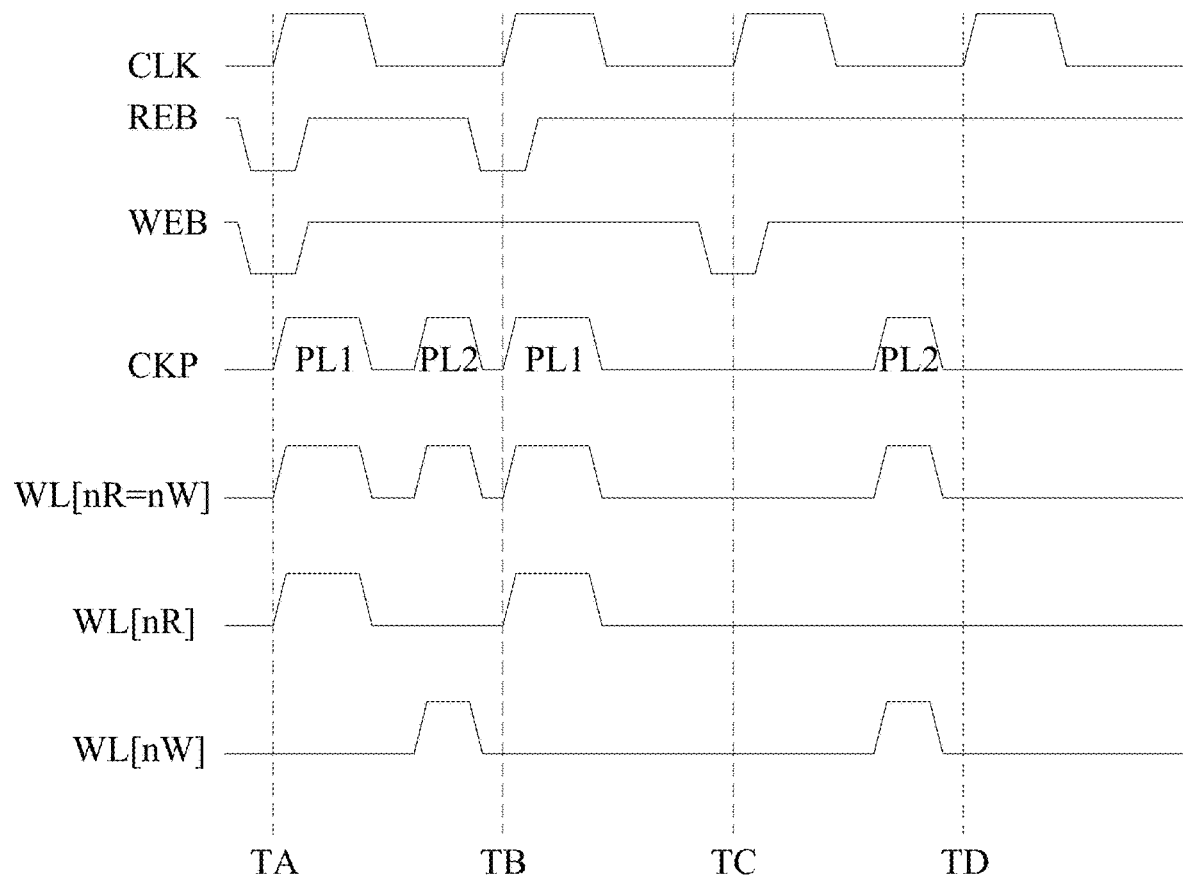

FIG. 2B is a plot of memory circuit 100 operating parameters, in accordance with some embodiments. FIG. 2B depicts non-limiting examples of word line signals WL[1]-WL[N] generated in response to received addresses RX and WX, clock signal CLK, and enable signals REB and WEB. The non-limiting example of FIG. 2B illustrates four clock signal periods, TA, TB, TC, and TD, and includes each of enable signals REB and WEB having the low logical state corresponding to the enabled state, and word line signals WL[1]-WL[N] having the high logical state corresponding to the activated state. An address nR is a non-limiting example of received address RX and an address nW is a non-limiting example of received address WX.

At the start of clock signal period TA, enable signal REB has the low logical state corresponding to an enabled read operation, and enable signal WEB has the low logical state corresponding to an enabled write operation. At the start of clock signal period TB, enable signal REB has the low logical state corresponding to an enabled read operation, and enable signal WEB has the high logical state corresponding to a disabled write operation. At the start of clock signal period TC, enable signal REB has the high logical state corresponding to a disabled read operation, and enable signal WEB has the low logical state corresponding to an enabled write operation. At the start of clock signal period TD, enable signal REB has the high logical state corresponding to a disabled read operation, and enable signal WEB has the high logical state corresponding to a disabled write operation.

Accordingly, circuit 100 generates clock pulse signal CKP including each of pulses PL1 and PL2 during clock signal period TA, pulse PL1 and not pulse PL2 during clock signal period TB, pulse PL2 and not pulse PL1 during clock signal period TC, and neither one of pulses PL1 and PL2 during clock signal period TD.

FIG. 2B depicts non-limiting examples of word line signals WL[1]-WL[N] for two cases: a first case in which a single word line signal WL[nR=nW] corresponds to address nR being the same as address nW; and a second case in which a word line signal WL[nR] corresponds to address nR and a word line signal WL[nW] corresponds to address nW different from address nR. In various embodiments, each of addresses nR and nW has the number L equal to 4, and one or both of addresses nR or nW is equal to 0000 and/or 1111.

In the first case, during clock signal period TA, decoder 150 generates word line signal WL[nR=nW] including the activated read state in response to address nR and pulse PL1, and the activated write state in response to address nW and pulse PL2. During clock signal period TB, decoder 150 generates word line signal WL[nR=nW] including the activated read state in response to address nR and pulse PL1, and not including the activated write state. During clock signal period TC, decoder 150 generates word line signal WL[nR=nW] not including the activated read state and including the activated write state in response to address nW and pulse PL2. During clock signal period TD, decoder 150 generates word line signal WL[nR=nW] not including the activated read state and not including the activated write state.

In the second case, during clock signal period TA, decoder 150 generates word line signal WL[nR] including the activated read state in response to address nR and pulse PL1 and not including the activated write state, and generates word line signal WL[nW] not including the activated read state and including the activated write state in response to address nW and pulse PL2. During clock signal period TB, decoder 150 generates word line signal WL[nR] including the activated read state in response to address nR and pulse PL1 and not including the activated write state, and generates word line signal WL[nW] not including the activated read state and not including the activated write state. During clock signal period TC, decoder 150 generates word line signal WL[nR] not including the activated read state and not including the activated write state, and generates word line signal WL[nW] not including the activated read state and including the activated write state in response to address nW and pulse PL2. During clock signal period TD, decoder 150 generates word line signal WL[nR] not including the activated read state and not including the activated write state, and generates word line signal WL[nW] not including the activated read state and not including the activated write state.

By the configuration discussed above, memory circuit 100 is capable of selecting and decoding one of two addresses corresponding to data movement operations in memory array 160 using decoder 150 and selection circuit 120 during a single clock period. Memory circuit 100 thereby has reduced area requirements compared to approaches in which separate decoders are used during a single clock period for each of two addresses in memory array data movement operations.

Significant area reduction is achieved by reducing a number of data lines used to activate a given word in a memory array. By reducing the number of decoders from two to one, the number of data lines that carry the enable signal used to activate the given word is similarly reduced from two to one.

Figure 3A:
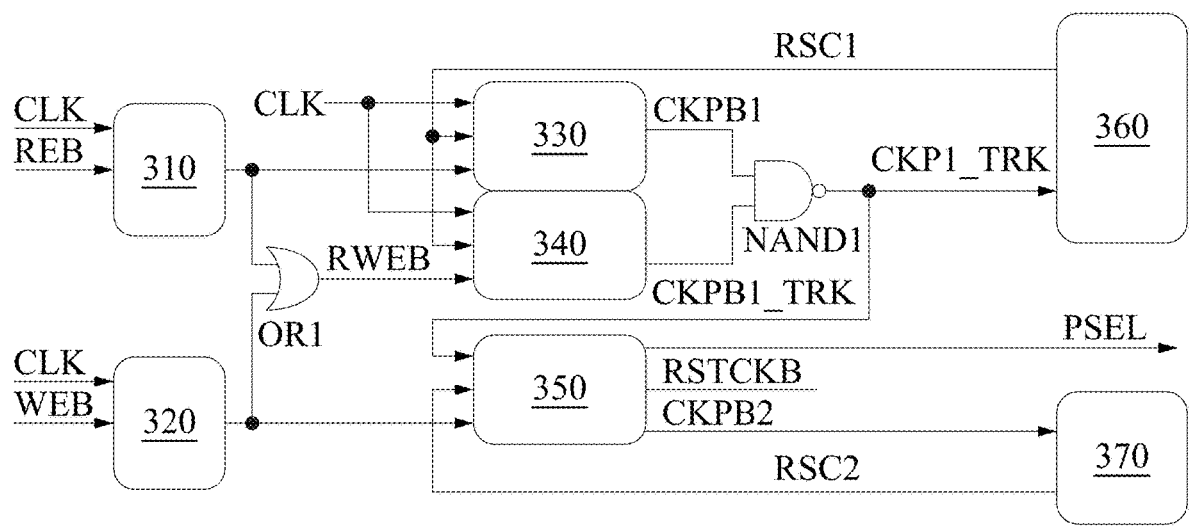
FIGS. 3A and 3B are diagrams of a control circuit, in accordance with some embodiments.
Figure 3B:
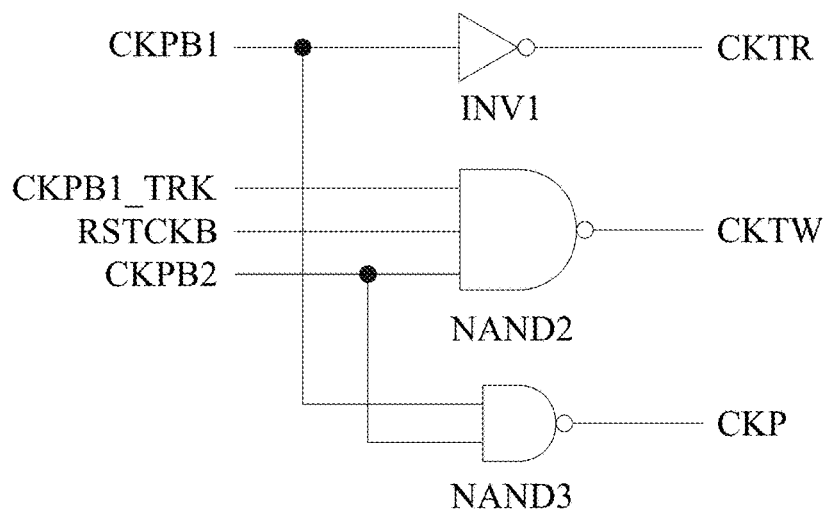

FIGS. 3A and 3B are diagrams of control circuit 300, in accordance with some embodiments. Control circuit 300 is usable as control circuit 170 discussed above with respect to memory circuit 100 and FIGS. 1-2B.

FIG. 3A depicts a signal generation portion of control circuit 300 configured to generate various signals including select signal PSEL based on clock signal CLK and enable signals REB and WEB, and FIG. 3B depicts a clock buffer portion of control circuit 300 configured to generate clock pulse signals CKTW, CKTR, and CKP based on the various signals, as discussed below.

The signal generation portion of control circuit 300 includes latch circuits 310 and 320, signal generation circuits 330, 340, and 350, port tracking circuits 360 and 370, OR gate OR1, and NAND gate NAND1. The clock buffer portion of control circuit 300 includes inverter INV1 and NAND gates NAND2 and NAND3.

An output of latch circuit 310 is coupled to an input of signal generation circuit 330 and to an input of OR gate OR1. An output of latch circuit 320 is coupled to an input of signal generation circuit 350 and to an input of OR gate OR1. An output of OR gate OR1 is coupled to an input of signal generation circuit 340.

An output of signal generation circuit 330 is coupled to an input of NAND gate NAND1, an output of signal generation circuit 340 is coupled to the other input of NAND gate NAND1, and an output of signal generation circuit 350 is coupled to an input of port tracking circuit 370. An output of NAND gate NAND1 is coupled to an input of port tracking circuit 360.

An output of port tracking circuit 360 is coupled to an input of signal generation circuit 330 and to an input of signal generation circuit 340. An output of port tracking circuit 370 is coupled to an input of signal generation circuit 350.

Latch circuit 310 is an electronic circuit configured to receive enable signal REB and clock signal CLK and, responsive to clock signal CLK, latch and output enable signal REB to signal generation circuit 330 and OR gate OR1.

Latch circuit 320 is an electronic circuit configured to receive enable signal WEB and clock signal CLK and, responsive to clock signal CLK, latch and output enable signal WEB to signal generation circuit 350 and OR gate OR1.

OR gate OR1 is a logic gate configured to receive latched enable signals REB and WEB and, responsive to latched enable signals REB and WEB, output an enable signal RWEB to signal generation circuit 340.

Signal generation circuit 330 is an electronic circuit configured to receive clock signal CLK, latched enable signal REB, and a reset signal RSC1, and responsive to clock signal CLK, latched enable signal REB, and reset signal RSC1, output a clock pulse signal CKPB1 to NAND gates NAND1 and NAND3 and inverter INV1. Signal generation circuit 330 is configured to generate clock pulse signal CKPB1 including logical state transitions discussed below with respect to FIGS. 4A and 4B. In some embodiments, signal generation circuit 330 is a signal generation circuit 500 discussed below with respect to FIG. 5.

Signal generation circuit 340 is an electronic circuit configured to receive clock signal CLK, enable signal RWEB, and reset signal RSC1, and responsive to clock signal CLK, enable signal RWEB, and reset signal RSC1, output a clock pulse signal CKPB1_TRK to NAND gates NAND1 and NAND2. Signal generation circuit 340 is configured to generate clock pulse signal CKPB1_TRK including logical state transitions discussed below with respect to FIGS. 4A and 4B. In some embodiments, signal generation circuit 340 is signal generation circuit 500 discussed below with respect to FIG. 5.

Signal generation circuit 350 is an electronic circuit configured to receive a clock pulse signal CKP1_TRK, latched enable signal WEB, and a reset signal RSC2, and responsive to clock pulse signal CKP1_TRK, latched enable signal WEB, and reset signal RSC2, output a clock pulse signal CKPB2 to port tracking circuit 370 and NAND gates NAND2 and NAND3, a reset signal RSTCKB to NAND gate NAND2, and select signal PSEL discussed above with respect to FIGS. 1 and 2A. Signal generation circuit 330 is configured to generate clock pulse signal CKPB2, reset signal RSTCKB, and select signal PSEL including logical state transitions discussed below with respect to FIG. 4A. In some embodiments, signal generation circuit 350 is a signal generation circuit 600 discussed below with respect to FIG. 6.

NAND gate NAND1 is a logic gate configured to receive clock pulse signals CKPB1 and CKPB1_TRK and, responsive to clock pulse signals CKPB1 and CKPB1_TRK, output a clock pulse signal CKP1_TRK to port tracking circuit 360.

Port tracking circuit 360 is an electronic circuit configured to receive clock pulse signal CKP1_TRK and generate reset signal RSC1 responsive to a timing of a tracking circuit (not shown) configured to replicate a read operation using port IP1 and initiated by clock pulse signal CKP1_TRK, thereby generating reset signal RSC1 including a logical state transition after a tracking interval sufficiently long to ensure completion of a read operation on port IP1.

Port tracking circuit 370 is an electronic circuit configured to receive clock pulse signal CKPB2 and generate reset signal RSC2 responsive to a timing of a tracking circuit (not shown) configured to replicate a write operation using port IP2 and initiated by clock pulse signal CKPB2, thereby generating reset signal RSC2 including a logical state transition after a tracking interval sufficiently long to ensure completion of a write operation on port IP2.

Inverter INV1 is a logic gate configured to receive clock pulse signal CKPB1 and output inverted clock pulse signal CKPB1 as clock pulse signal CKTR discussed above with respect to FIGS. 1 and 2A and discussed below with respect to FIG. 4B.

NAND gate NAND2 is a logic gate configured to receive clock pulse signals CKPB1_TRK and CKPB2 and reset signal RSTCKB and, responsive to clock pulse signals CKPB1_TRK and CKPB2 and reset signal RSTCKB, output clock pulse signal CKTW discussed above with respect to FIGS. 1 and 2A and discussed below with respect to FIG. 4B.

NAND gate NAND3 is a logic gate configured to receive clock pulse signals CKPB1 and CKPB2 and, responsive to clock pulse signals CKPB1 and CKPB2, output clock pulse signal CKP discussed above with respect to FIGS. 1-2B and discussed below with respect to FIG. 4B.

Figure 4A:
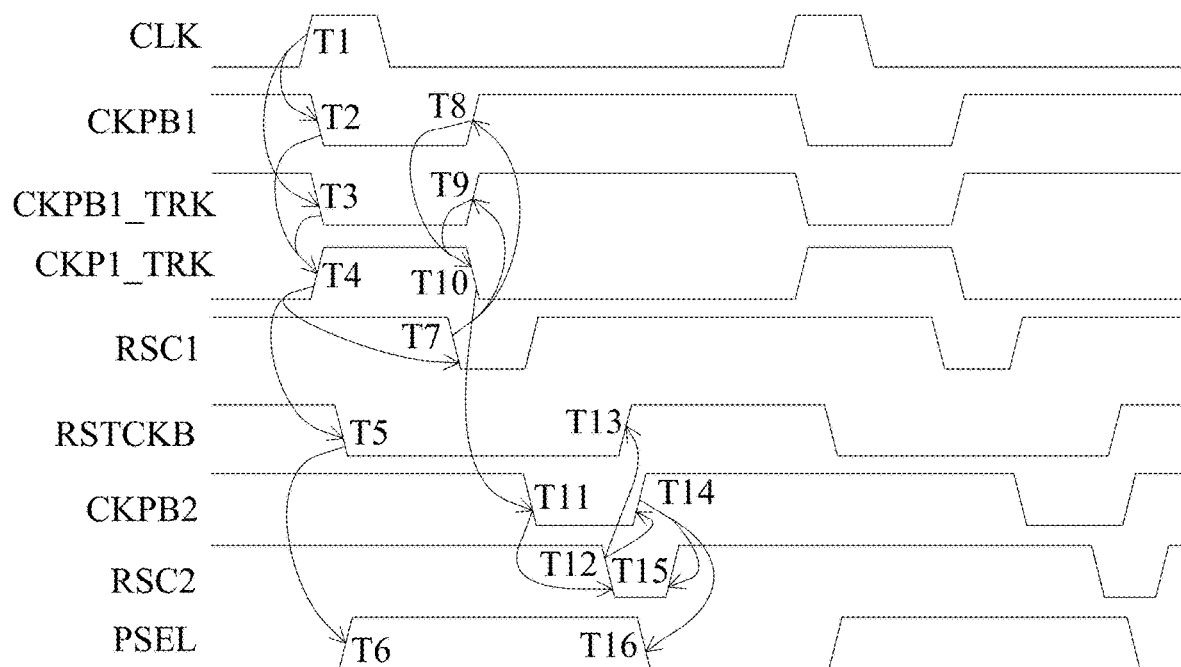
FIGS. 4A and 4B are plots of memory circuit operating parameters, in accordance with some embodiments.
Figure 4B:
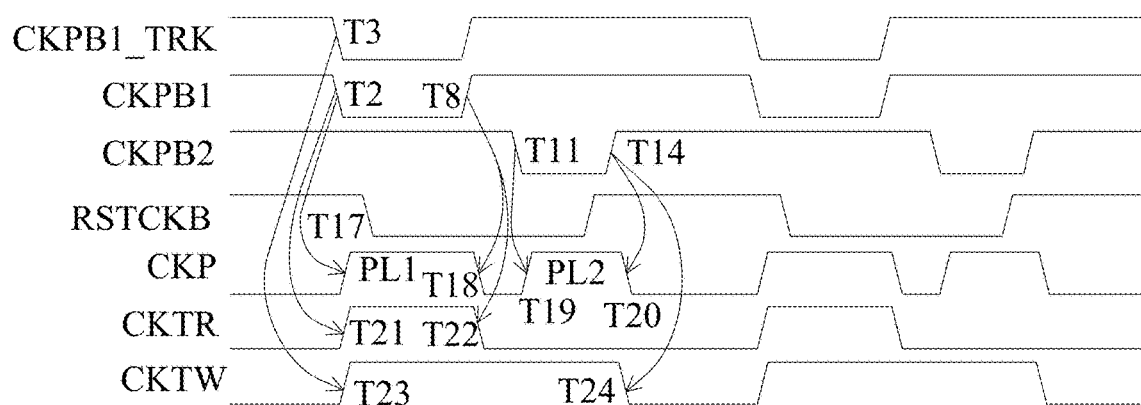

FIGS. 4A and 4B are plots of memory circuit 100 and control circuit 300 operating parameters, in accordance with some embodiments. In the non-limiting example depicted in FIGS. 4A and 4B, signals CLK, CKPB1, CKPB1_TRK, CKP1_TRK, RSC1, RSTCKB, CKPB2, RSC2, PSEL, CKP, CKTR, and CKTW include transitions T1-T24 between the high and low logical states corresponding to control circuit 300 operation as discussed below. FIGS. 4A and 4B depict a case in which enable signals REB, WEB, and thereby RWEB, have logical states corresponding to an enabled state and are not shown for the purpose of clarity.

As depicted in FIG. 4A, transition T1 is a rising edge of clock signal CLK. In response to transition T1, signal generation circuit 330 generates transition T2, a falling edge of clock pulse signal CKPB1, and signal generation circuit 340 generates transition T3, a falling edge of clock pulse signal CKPB1_TRK. In the case depicted in FIGS. 4A and 4B in which signal generation circuits 330 and 340 are both enabled, transitions T2 and T3 are generated simultaneously. In response to either of transitions T2 or T3, NAND gate NAND1 generates transition T4, a rising edge of clock pulse signal CKP1_TRK.

In response to transition T4, signal generation circuit 350 generates transition T5, a falling edge of reset signal RSTCKB, and, in response to transition T5, generates transition T6, a rising edge of select signal PSEL. In response to transition T4, and after the tracking interval discussed above, port tracking circuit 360 generates transition T7, a falling edge of reset signal RSC1.

In response to transition T7, signal generation circuit 330 generates transition T8, a rising edge of clock pulse signal CKPB1, and signal generation circuit 340 generates transition T9, a rising edge of clock pulse signal CKPB1_TRK. In response to transitions T8 and T9, NAND gate NAND1 generates transition T10, a falling edge of clock pulse signal CKP1_TRK.

In response to transition T10, signal generation circuit 350 generates transition T11, a falling edge of clock pulse signal CPKB2. In response to transition T11, and after the tracking interval discussed above, port tracking circuit 370 generates transition T12, a falling edge of reset signal RSC2.

In response to transition T12, signal generation circuit 350 generates transition T13, a rising edge of reset signal RSTCKB, and transition T14, a rising edge of clock pulse signal CKPB2.

In response to transition T14, port tracking circuit 370 generates transition T15, a rising edge of reset signal RSC2, and signal generation circuit 350 generates transition T16, a falling edge of select signal PSEL.

As depicted in FIG. 4B, in response to transitions T2 and T8, the respective falling and rising edges of clock pulse signal CKPB1, NAND gate NAND3 generates transitions T17 and T18. Transitions T17 and T18, the respective rising and falling edges of pulse PL1 of clock pulse signal CKP, thereby correspond to a pulse width of pulse PL1 based on clock pulse signal CKPB1.

In response to transitions T11 and T14, the respective falling and rising edges of clock pulse signal CKPB2, NAND gate NAND3 generates transitions T19 and T20. Transitions T19 and T20, the respective rising and falling edges of pulse PL2 of clock pulse signal CKP, thereby correspond to a pulse width of pulse PL2 based on clock pulse signal CKPB2.

In response to transitions T2 and T8, the respective falling and rising edges of clock pulse signal CKPB1, inverter INV1 generates transitions T21 and T22, respective rising and falling edges of clock pulse signal CKTR.

In response to transitions T3 and T14, the respective falling edge of clock pulse signal CKPB1_TRK and rising edge of clock pulse signal CKPB2, NAND gate NAND2 generates transitions T23 and T24, respective rising and falling edges of clock pulse signal CKTW.

Transition T17 is generated by NAND gate NAND3 in response to transition T2, and thereby follows transition T2 by a single gate delay, a time interval corresponding to a logical state transition in a logic gate. Transition T21 is generated by inverter INV1 in response to transition T2, and thereby follows transition T2 by a single gate delay. Transition T23 is generated by NAND gate NAND2 in response to transition T3, simultaneous with transition T2, and thereby follows transition T2 by a single gate delay.

By causing each of transitions T17, T21, and T23, the rising edges of respective clock pulse signals CKP, CKTR, and CKTW, to follow transition T2 by a single gate delay, control circuit 300 is configured to generate the rising edges of respective clock pulse signals CKP, CKTR, and CKTW at or near time t1 as discussed above with respect to FIG. 2A.

Transition T4 is generated by NAND gate NAND1 in response to either of simultaneous transitions T2 or T3, and thereby follows transition T2 by a single gate delay. Transition T6 is generated by signal generation circuit 350 in response to transition T4, and thereby follows transition T4 by at least one gate delay and follows transition T2 by at least two gate delays.

By causing transition T6, the rising edge of select signal PSEL, to follow transition T2 by at least two gate delays, control circuit 300 is configured to generate the rising edge of select signal PSEL at time t2 subsequent to time t1 as discussed above with respect to FIG. 2A, thereby ensuring that latch circuit 130 has latched address RX based on transition T21 of clock pulse signal CKTR prior to selection circuit 120 ceasing to pass address RX to latch circuit 130 based on the rising edge of select signal PSEL.

Because transition T18, the falling edge of pulse PL1 of clock pulse signal CKP, and transition T22, the falling edge of clock pulse signal CKTR, follow transition T7, the falling edge of reset signal RSC1, after the corresponding tracking interval has elapsed, control circuit 300 is configured to cause partially decoded address PD to be output from pre-decoder 140 based on latched address RX until time t3, discussed above with respect to FIG. 2A, thereby ensuring completion of the corresponding read operation prior to signal transitions T18 and T22.

By causing transition T16, the falling edge of select signal PSEL, to follow transitions T18 and T22, control circuit 300 is configured to cause selection circuit 120 and latch circuit 130 to pass latched address WX to pre-decoder 140 after completion of the corresponding read operation.

By causing transition T19, the rising edge of pulse PL2 of clock pulse signal CKP, to follow transition T18, the falling edge of pulse PL1 of clock pulse signal CKP, control circuit 300 is configured to provide the interval from time t3 to time t4, discussed above with respect to FIG. 2A, thereby ensuring that latched address WX is being passed to pre-decoder 140 prior to the start of a subsequent write operation.

By including OR gate OR1, signal generation circuits 330 and 340, and NAND gate NAND1, control circuit 300 is configured to generate transition T10 in clock pulse signal CKP1_TRK in response to either of enable signals REB or WEB having the logical state corresponding to an enabled state, thereby causing pulse PL2 of clock pulse signal CKP to start at time t4 so that a write operation has a timing relative to clock signal CLK independent of the execution of a read operation.

As discussed above, transition T12, the falling edge of reset signal RSC2, occurs after the tracking interval corresponding to a write operation has elapsed. Transition T14, the rising edge of clock pulse signal CKPB2, follows transition T12. Because transition T20, the falling edge of pulse PL2 of clock pulse signal CKP, and transition T24, the falling edge of clock pulse signal CKTW, follow transition T14, control circuit 300 is configured to cause partially decoded address PD to be output from pre-decoder 140 based on latched address WX until time t5, discussed above with respect to FIG. 2A, thereby ensuring completion of the corresponding write operation prior to signal transitions T20 and T24.

As indicated above, FIGS. 4A and 4B depict a case in which each of enable signals REB and WEB has a logical state corresponding to an enabled state. In a case in which enable signal REB has a logical state corresponding to a disabled state, signal generation circuit 330 is configured so that transitions T2 and T8 in clock pulse signal CKPB1 are not generated, and control circuit 300 is thereby configured to respond to the disabled state by generating clock pulse signal CKP without pulse PL1, as discussed above with respect to FIG. 2B, so that pre-decoder 140 does not output partially decoded address PD during the interval from time t1 to time t3.

In a case in which enable signal WEB has a logical state corresponding to a disabled state, signal generation circuit 350 is configured so that transitions T11 and T14 in clock pulse signal CKPB2 are not generated, and control circuit 300 is thereby configured to respond to the disabled state by generating clock pulse signal CKP without pulse PL2, as discussed above with respect to FIG. 2B, so that pre-decoder 140 does not output partially decoded address PD during the interval from time t4 to time t5.

In addition to the timing features discussed above with respect to the configuration depicted in FIGS. 3A and 3B, control circuit 300 is capable of generating clock pulse signals CKTW, CKTR, and CKP, and select signal PSEL based on clock signal CLK and enable signals REB and WEB having the timing control and benefits discussed above with respect to memory circuit 100 and FIGS. 1-2B.

Figure 5:
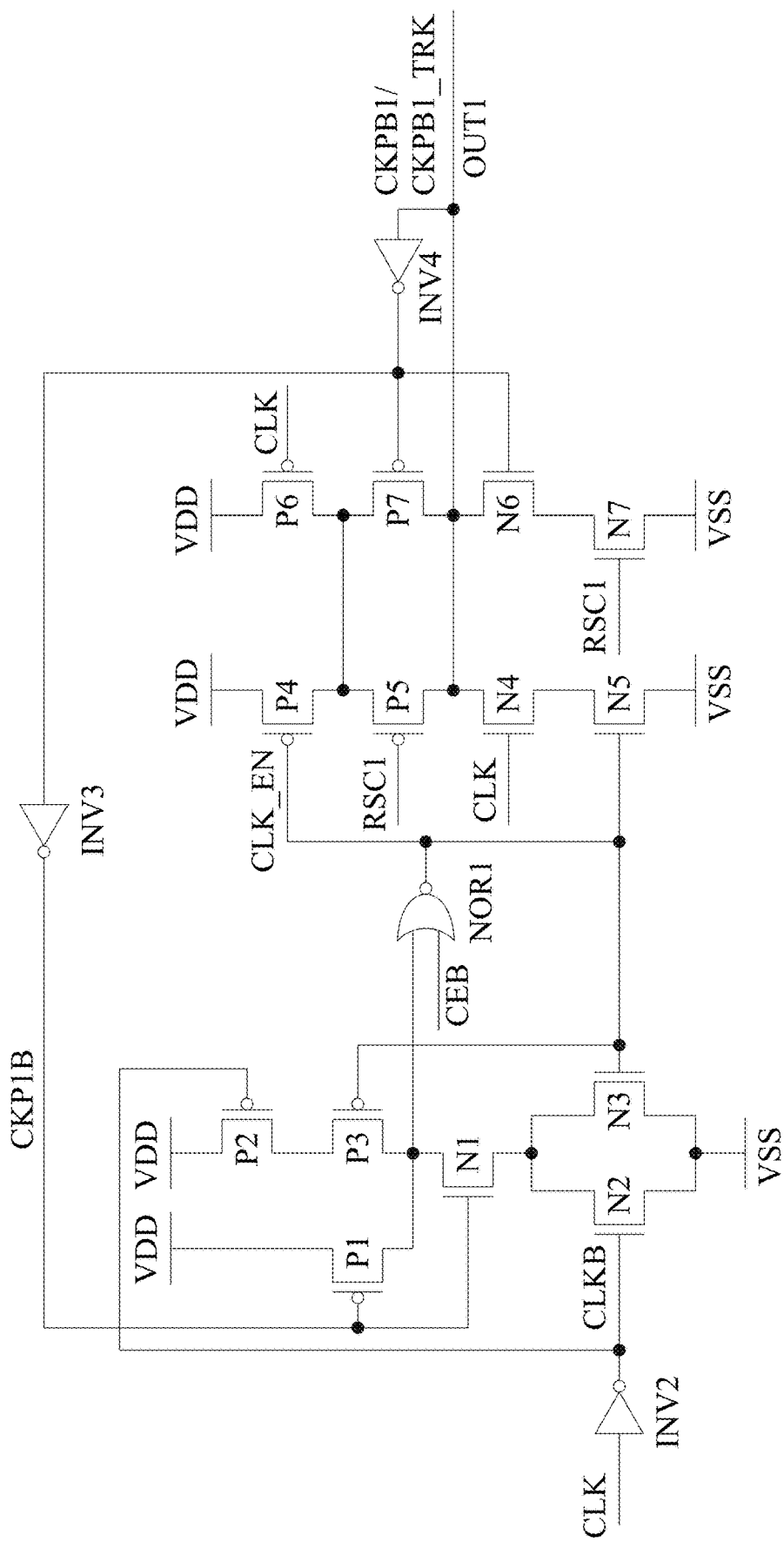
FIG. 5 is a diagram of a signal generation circuit, in accordance with some embodiments.

FIG. 5 is a diagram of signal generation circuit 500, in accordance with some embodiments. Signal generation circuit 500 is usable as one or both of signal generation circuits 330 or 340 discussed above with respect to control circuit 300 and FIGS. 3A-4B.

Signal generation circuit 500 includes p-type metal-oxide-semiconductor (PMOS) transistors P1-P7, n-type metal-oxide-semiconductor (NMOS) transistors N1-N7, and logic gates inverters INV2-INV4 and NOR gate NOR1.

Transistors P1, N1, and N2 are coupled in series between a power supply node VDD and a reference node VSS. A source terminal of transistor P1 is coupled to power supply node VDD, a drain terminal of transistor P1 is coupled to a drain terminal of transistor N1, a source terminal of transistor N1 is coupled to a drain terminal of transistor N2, and a source terminal of transistor N2 is coupled to reference node VSS.

Transistors P2 and P3 are coupled in series with each other and parallel to transistor P1. A source terminal of transistor P2 is coupled to power supply node VDD, a drain terminal of transistor P2 is coupled to a source terminal of transistor P3, and a drain terminal of transistor P3 is coupled to the drain terminals of transistors P1 and N1.

Transistor N3 is coupled in parallel with transistor N2. A drain terminal of transistor N3 is coupled to the drain terminal of transistor N2, and a source terminal of transistor N3 is coupled to reference node VSS.

Transistors P4, P5, N4, and N5 are coupled in series between power supply node VDD and reference node VSS. A source terminal of transistor P4 is coupled to power supply node VDD, a drain terminal of transistor P4 is coupled to a source terminal of transistor P5, a drain terminal of transistor P5 is coupled to a drain terminal of transistor N4, a source terminal of transistor N4 is coupled to a drain terminal of transistor N5, and a source terminal of transistor N5 is coupled to reference node VSS.

Transistors P6, P7, N6, and N7 are coupled in series between power supply node VDD and reference node VSS. A source terminal of transistor P6 is coupled to power supply node VDD, a drain terminal of transistor P6 is coupled to a source terminal of transistor P7, a drain terminal of transistor P7 is coupled to a drain terminal of transistor N6, a source terminal of transistor N6 is coupled to a drain terminal of transistor N7, and a source terminal of transistor N7 is coupled to reference node VSS.

The drain terminals of transistors P4 and P6 and the source terminals of transistors P5 and P7 are coupled to each other, gates of transistors P5 and N7 are configured to receive reset signal RSC1, discussed above with respect to control circuit 300 and FIGS. 3A-4B, and gates of transistors P6 and N4 are configured to receive clock signal CLK.

The drain terminals of transistors P5, P7, N4, and N6 are coupled to each other and to an output OUT1, and are thereby configured to output one of clock pulse signals CKPB1 or CKPB1_TRK discussed above with respect to control circuit 300 and FIGS. 3A-4B.

Inverter INV2 is coupled to gates of transistors P2 and N2, and is thereby configured to receive clock signal CLK and output inverted clock signal CLK as clock signal CLKB to the gates of transistors P2 and N2.

Inverter INV3 is coupled between inverter INV4 and gates of transistors P1 and N1, and is thereby configured to output signal CKP1B to the gates of transistors P1 and N1.

Inverter INV4 is coupled between output OUT1 and inverter INV3 and gates of transistors P7 and N6, and is thereby configured to output inverted clock pulse signal CKPB1 or CKPB1_TRK to inverter INV3 and the gates of transistors P7 and N6.

NOR gate NOR1 is coupled to the drains of transistors P1, P3, and N1 and to gates of transistors P3, P4, N3, and N5, and is thereby configured to receive signal CEB, the complement of one of latched enable signals REB or RWEB, discussed above with respect to memory circuit 100, control circuit 300, and FIGS. 1-4B, and output signal CLK_EN to the gates of transistors P3, P4, N3, and N5.

In operation, an initial state of signal generation circuit 500 includes clock signal CLK having the low logical state, signal CEB having the low logical state corresponding to activation of signal generation circuit 500, reset signal RSC1 having the high logical state, and the clock pulse signal CKPB1 or CKPB1_TRK having the high logical state.

In response to clock signal CLK having the low logical state, inverter INV2 outputs signal CLKB having the high logical state, thereby turning off transistor P2 and turning on transistor N2 and configuring transistors P1 and N1 as an inverter.

Reset signal RSC1 having the high logical state turns off transistor P5, and clock signal CLK having the low logical state turns off transistor N4, thereby decoupling output OUT1 from transistors P4 and N5.

Clock signal CLK having the low logical state turns on transistor P6, and reset signal RSC1 having the high logical state turns on transistor N7, thereby configuring transistors P7 and N6 as an inverter cross-coupled with inverter INV4.

In response to signal CEB having the low logical state, NOR gate NOR1 outputs signal CLK_EN responsive to the logical state of the drains of transistors P1, P3, and N1.

In response to the clock pulse signal CKPB1 or CKPB1_TRK having the high logical state, inverter INV4 outputs the low logical state, and inverter INV3 outputs signal CKP1B having the high logical state, turning off transistor P1 and turning on transistor N1. The drains of transistors P1, P3, and N1 have the low logical state, and NOR gate NOR1 outputs signal CLK_EN having the high logical state, thereby turning off transistors P3 and P4 and turning on transistors N3 and N5.

In response to transition T1 of clock signal CLK, discussed above with respect to control circuit 300 and FIGS. 3A-4B, clock signal CLK having the high logical state turns off transistor P6 and turns on transistor N4, thereby decoupling output OUT1 from power supply node VDD, coupling output OUT1 to reference node VSS through transistors N4 and N5, and causing the clock pulse signal CKPB1 or CKPB1_TRK to have the low logical state. The clock pulse signal CKPB1 or CKPB1_TRK changing from the high logical state to the low logical state corresponds to the respective transition T2 or T3 discussed above with respect to control circuit 300 and FIGS. 3A-4B.

In response to clock signal CLK having the high logical state, inverter INV2 outputs signal CLKB having the low logical state, thereby turning on transistor P2 and turning off transistor N2.

In response to the clock pulse signal CKPB1 or CKPB1_TRK having the low logical state, inverter INV4 outputs the high logical state, and inverter INV3 outputs signal CKP1B having the low logical state, turning on transistor P1 and turning off transistor N1. The drains of transistors P1, P3, and N1 have the high logical state, and NOR gate NOR1 outputs signal CLK_EN having the low logical state, thereby turning on transistors P3 and P4 and turning off transistors N3 and N5.

Because of gate delays introduced by inverter INV3, transistors P1 and N1, and NOR gate NOR1, transistor N5 is turned off after transistor N7 is turned on, and output OUT1 is coupled to reference node VSS through transistors N6 and N7.

In response to transition T7 of reset signal RSC1, discussed above with respect to control circuit 300 and FIGS. 3A-4B, reset signal RSC1 having the low logical state turns on transistor P5 and turns off transistor N7, thereby decoupling output OUT1 from reference node VSS, coupling output OUT1 to power supply node VDD through transistors P4 and P5, and causing the clock pulse signal CKPB1 or CKPB1_TRK to have the high logical state. The clock pulse signal CKPB1 or CKPB1_TRK changing from the low logical state to the high logical state corresponds to the respective transition T8 or T9 discussed above with respect to control circuit 300 and FIGS. 3A-4B.

By the configuration depicted in FIG. 5 and discussed above, signal generation circuit 500 is capable of generating each of clock pulse signals CKPB1 or CKPB1_TRK responsive to clock signal CLK, the corresponding enable signal REB or RWEB, and reset signal RSC1 having the timing control and benefits discussed above with respect to memory circuit 100, control circuit 300, and FIGS. 1-4B.

Figure 6:
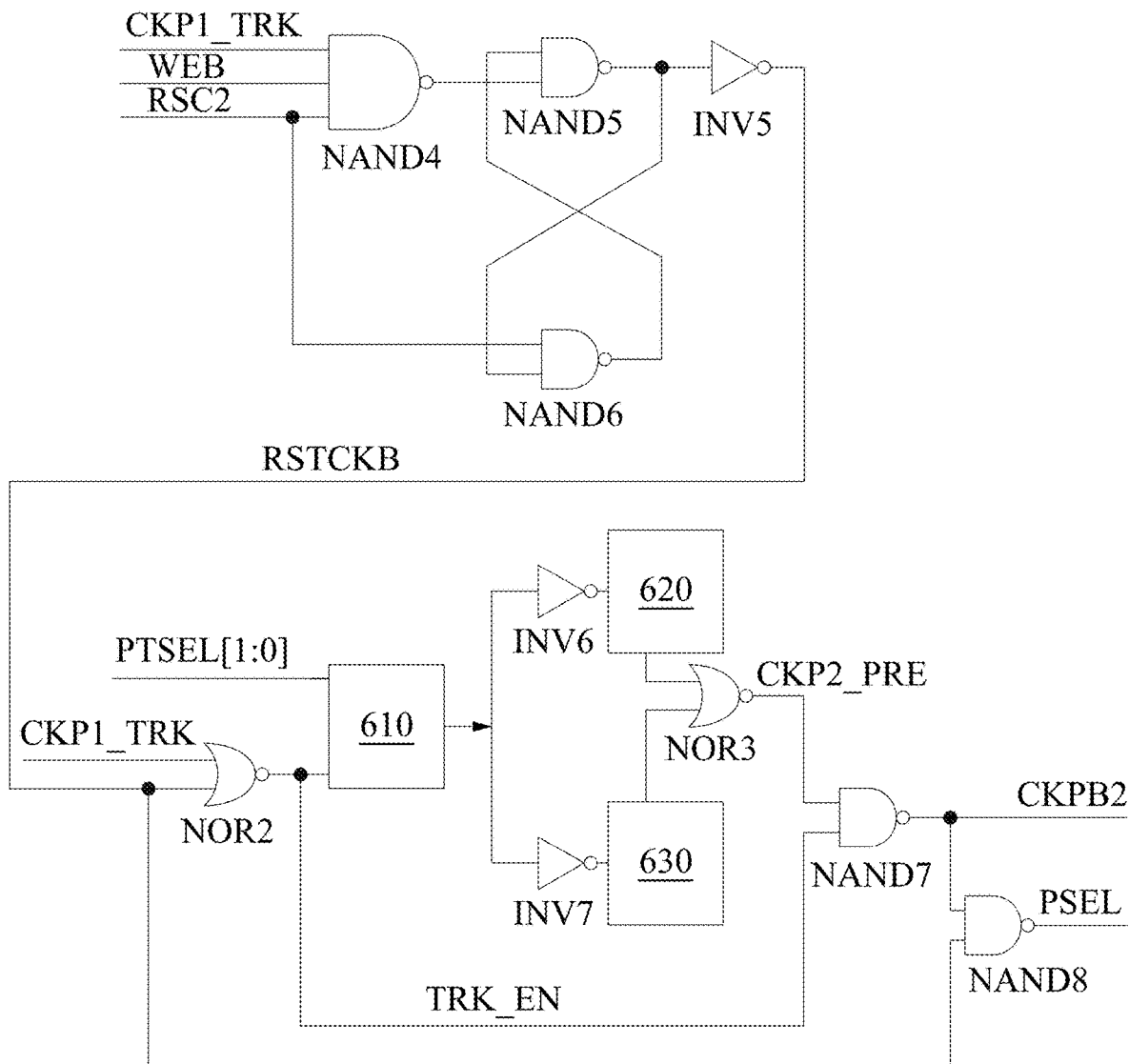
FIG. 6 is a diagram of a signal generation circuit, in accordance with some embodiments.

FIG. 6 is a diagram of signal generation circuit 600, in accordance with some embodiments. Signal generation circuit 600 is usable as signal generation circuit 350 discussed above with respect to control circuit 300 and FIGS. 3A-4B.

Signal generation circuit 600 includes logic gates NAND gates NAND4-NAND8, inverters INV5-INV7, and NOR gates NOR2 and NOR3, a delay circuit 610, and word tracking circuits 620 and 630.

NAND gate NAND4 includes inputs configured to receive clock pulse signal CKP1_TRK, enable signal WEB, and reset signal RSC2, and an output coupled to an input of NAND gate NAND5.

NAND gate NAND5 includes an input coupled to an output of NAND gate NAND6 and an output coupled to an input of NAND gate NAND6 and an input of inverter INV5. NAND gate NAND6 includes an input configured to receive reset signal RSC2.

Inverter INV5 includes an output coupled to an input of NOR gate NOR2 and an input of NAND gate NAND5, and is thereby configured to output reset signal RSTCKB. NOR gate NOR2 includes an input configured to receive clock pulse signal CKP1_TRK, and an output coupled to delay circuit 610 and an input of NAND gate NAND7, and is thereby configured to output signal TRK_EN.

Inverter INV6 includes an input coupled to delay circuit 610 and an output coupled to word tracking circuit 620. Inverter INV7 includes an input coupled to delay circuit 610 and an output coupled to word tracking circuit 630. NOR gate NOR3 includes inputs coupled to each of word tracking circuits 620 and 630, and an output coupled to an input of NAND gate NAND7, and is thereby configured to output signal CKP2_PRE to NAND gate NAND7.

NAND gate NAND7 includes an output coupled to an input of NAND gate NAND8 and configured to output clock pulse signal CKPB2, discussed above with respect to control circuit 300 and FIGS. 3A-4B. NAND gate NAND8 is configured to output select signal PSEL, discussed above with respect to memory circuit 100, control circuit 300, and FIGS. 1-4B.

Delay circuit 610 is a configurable electronic circuit configured to delay signal TRK_EN outputted from NOR gate NOR2 by an interval determined by signal PTSEL[1:0], and to output the delayed signal TRK_EN. In the embodiment depicted in FIG. 6, delay circuit 610 is configured to receive signal PTSEL[1:0] having one of four logical state combinations, and to output signal TRK_EN having a corresponding delay equivalent to zero, two, four, or six gate delays. In various embodiments, delay circuit 610 is configured to receive signal PTSEL[1:0] having fewer or greater than four logical state combinations, and to output signal TRK_EN having a corresponding delay equivalent to a set of gate delays other than zero, two, four, or six gate delays.

In various embodiments, signal PTSEL[1:0] includes logical states corresponding to either voltage levels or short and open circuits configured by jumpers, pins, or other suitable conductive elements.

In operation, the configurable delay introduced by delay circuit 610 in response to signal PTSEL[1:0] is included in the timing of clock pulse signal CKPB2 and select signal PSEL, as discussed below. The timing of clock pulse signal CKPB2 and select signal PSEL thereby includes an overall delay that includes a predetermined delay component based on the configuration of delay circuit 610. Because the predetermined delay component is based on signal PTSEL[1:0], delay circuit 610 enables timing control to be adjusted based on user input reflecting timing requirements of the application in which signal generation circuit 600 is being used.

Each of word tracking circuits 620 and 630 is an electronic circuit configured to receive signal TRK_EN delayed by delay circuit 610 and inverted by respective inverter INV6 or INV7, and generate an output signal responsive to a timing of a tracking circuit (not shown) configured to replicate a write operation using port IP2 and initiated by delayed and inverted signal TRK_EN. Each of word tracking circuits 620 and 630 is thereby configured to generate the output signal including a logical state transition after a tracking interval sufficiently long to ensure completion of a write operation on port IP2.

Word tracking circuits 620 and 630 include tracking circuits configured to track separate aspects of the write operation such that the output signals generated by tracking circuits 620 and 630 include separate timing information. In some embodiments, word tracking circuit 620 includes tracking circuits configured to track timing based on a depth of a word line within a column of a memory array, e.g., memory array 160 discussed above with respect to memory circuit 100 and FIGS. 1-2B. In some embodiments, word tracking circuit 630 includes tracking circuits configured to track timing based on a width of a column of a memory array, e.g., memory array 160 discussed above with respect to memory circuit 100 and FIGS. 1-2B.

In operation, an initial state of signal generation circuit 600 includes clock pulse signal CKP1_TRK having the low logical state, enable signal WEB having the high logical state corresponding to activation of signal generation circuit 600, reset signal RSC2 having the high logical state, and NAND gate NAND5 outputting the low logical state latched to NAND gate NAND6 outputting the high logical state.

In response to clock pulse signal CKP1_TRK having the low logical state, NAND gate NAND4 outputs the high logical state to NAND gate NAND5. In response to NAND gate NAND5 having the low logical state, inverter INV5 outputs reset signal RSTCKB having the high logical state.

In response to clock pulse signal CKP1_TRK having the low logical state and reset signal RSTCKB having the high logical state, NOR gate NOR2 outputs signal TRK_EN having the low logical state. In response to signal TRK_EN having the low logical state, delay circuit 610 outputs the low logical state to each of inverters INV6 and INV7, each of inverters INV6 and INV7 outputs the high logical state to corresponding word tracking circuit 620 or 630, each of word tracking circuits 620 and 630 outputs the high logical state to NOR gate NOR3, and NOR gate NOR3 outputs signal CKP2_PRE having the low logical state.

In response to signal CKP2_PRE having the high logical state and signal TRK_EN having the low logical state, NAND gate NAND7 outputs clock pulse signal CKPB2 having the high logical state.

In response to clock pulse signal CKPB2 having the high logical state and reset signal RSTCKB having the high logical state, NAND gate NAND8 outputs select signal PSEL having the low logical state.

As a result of transition T4 of clock pulse signal CKP1_TRK, discussed above with respect to control circuit 300 and FIGS. 3A-4B, clock pulse signal CKP1_TRK has the high logical state. In response to clock pulse signal CKP1_TRK having the high logical state, NAND gate NAND4 outputs the low logical state, NAND gate NAND5 outputs the high logical state, and inverter INV5 outputs reset signal RSTCKB having the low logical state. Reset signal RSTCKB changing from the high logical state to the low logical state corresponds to transition T5 discussed above with respect to control circuit 300 and FIGS. 3A-4B.

In response to clock pulse signal CKP1_TRK having the high logical state and reset signal RSTCKB having the low logical state, NOR gate NOR2 continues to output signal TRK_EN having the low logical state, NOR gate NOR3 continues to output signal CKP2_PRE having the high logical state, and NAND gate NAND7 continues to output clock pulse signal CKPB2 having the high logical state.

In response to clock pulse signal CKPB2 having the high logical state and reset signal RSTCKB having the low logical state, NAND gate NAND8 outputs select signal PSEL having the high logical state. Select signal PSEL changing from the low logical state to the high logical state corresponds to transition T6 discussed above with respect to control circuit 300 and FIGS. 3A-4B.

As a result of transition T10 of clock pulse signal CKP1_TRK, discussed above with respect to control circuit 300 and FIGS. 3A-4B, clock pulse signal CKP1_TRK has the low logical state. In response to clock pulse signal CKP1_TRK having the low logical state, NAND gate NAND4 outputs the high logical state, and NAND gate NAND5 continues to output the high logical state in response to NAND gate NAND6 outputting the low logical state. Inverter INV5 therefore continues to output reset signal RSTCKB having the low logical state.

In response to each of clock pulse signal CKP1_TRK and reset signal RSTCKB having the low logical state, NOR gate NOR2 outputs signal TRK_EN having the high logical state. In response to signal TRK_EN having the high logical state, delay circuit 610 initially continues to output the low logical state, NOR gate NOR3 continues to output signal CKP2_PRE having the low logical state, and NAND gate NAND7 continues to output clock pulse signal CKPB2 having the high logical state.

After the configurable delay discussed above, delay circuit 610 outputs the high logical state to each of inverters INV6 and INV7, and each of inverters INV6 and INV7 outputs the low logical state to corresponding word tracking circuits 620 and 630.

Based on the timing discussed above, each of word tracking circuits 620 and 630 responds to the received low logical state by outputting the low logical state after a corresponding tracking delay. Until both of word tracking circuits 620 and 630 output the low logical state, NOR gate NOR3 continues to output signal CKP2_PRE having the low logical state. In response to both of word tracking circuits 620 and 630 outputting the low logical state, NOR gate NOR3 outputs signal CKP2_PRE having the high logical state.

In response to both output signal CKP2_PRE and signal TRK_EN having the high logical state, NAND gate NAND7 outputs clock pulse signal CKPB2 having the low logical state. Clock pulse signal CKPB2 changing from the high logical state to the low logical state corresponds to transition T11 discussed above with respect to control circuit 300 and FIGS. 3A-4B.

In response to each of clock pulse signal CKPB2 and reset signal RSTCKB having the low logical state, NAND gate NAND8 continues to output select signal PSEL having the high logical state.

In response to transition T12 of reset signal RSC2, discussed above with respect to control circuit 300 and FIGS. 3A-4B, reset signal RSC2 has the low logical state. In response to reset signal RSC2 having the low logical state, NAND gate NAND6 outputs the high logical state, NAND gate NAND5 outputs the low logical state, and inverter INV5 outputs reset signal RSTCKB having the high logical state. Reset signal RSTCKB changing from the low logical state to the high logical state corresponds to transition T13 discussed above with respect to control circuit 300 and FIGS. 3A-4B.

In response to clock pulse signal CKP1_TRK having the low logical state and reset signal RSTCKB having the high logical state, NOR gate NOR2 outputs signal TRK_EN having the low logical state. In response to signal TRK_EN having the low logical state and signal CKP2_PRE having either the low or high logical state, NAND gate NAND7 outputs clock pulse signal CKPB2 having the high logical state. Clock pulse signal CKPB2 changing from the low logical state to the high logical state corresponds to transition T14 discussed above with respect to control circuit 300 and FIGS. 3A-4B.

In response to each of clock pulse signal CKPB2 and reset signal RSTCKB having the high logical state, NAND gate NAND8 outputs select signal PSEL having the low logical state. Select signal PSEL changing from the high logical state to the low logical state corresponds to transition T16 discussed above with respect to control circuit 300 and FIGS. 3A-4B.

By the configuration depicted in FIG. 6 and discussed above, signal generation circuit 600 is capable of generating clock pulse signal CKPB2, reset signal RSTCKB, and select signal PSEL responsive to clock pulse signal CKP1_TRK, enable signal WEB, and reset signal RSC2 having the timing control and benefits discussed above with respect to memory circuit 100, control circuit 300, and FIGS. 1-4B.

Further, by the configuration depicted in FIG. 6 and discussed above, signal generation circuit 600 is capable of generating select signal PSEL including self-timing that ensures that read and write addresses are latched without requiring additional timing circuitry.

Figure 7A:
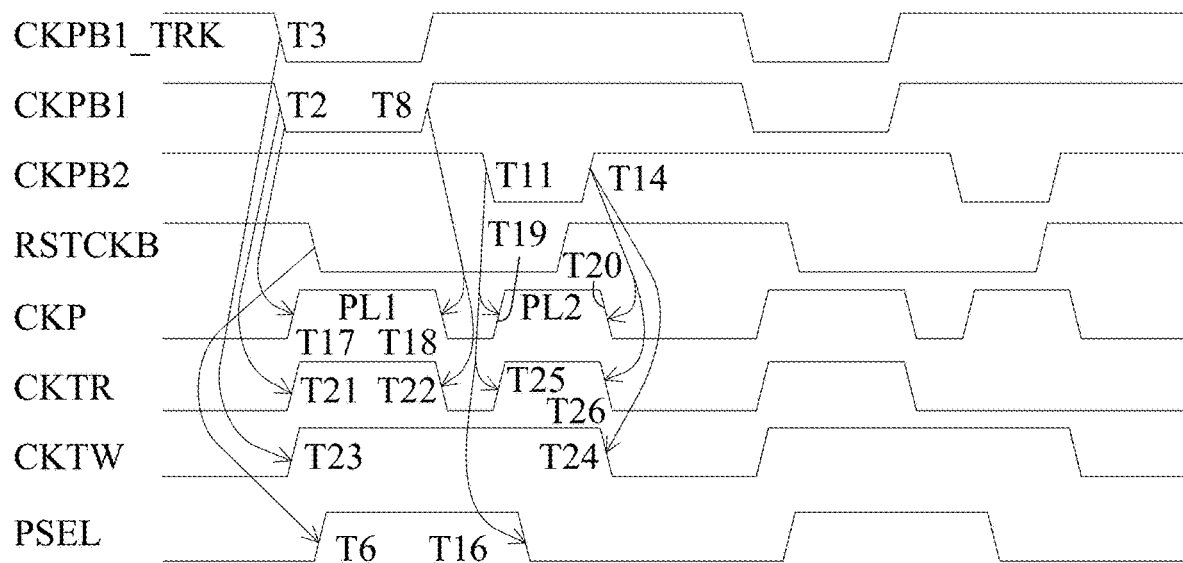
FIGS. 7A and 7B are plots of memory circuit operating parameters, in accordance with some embodiments.
Figure 7B:
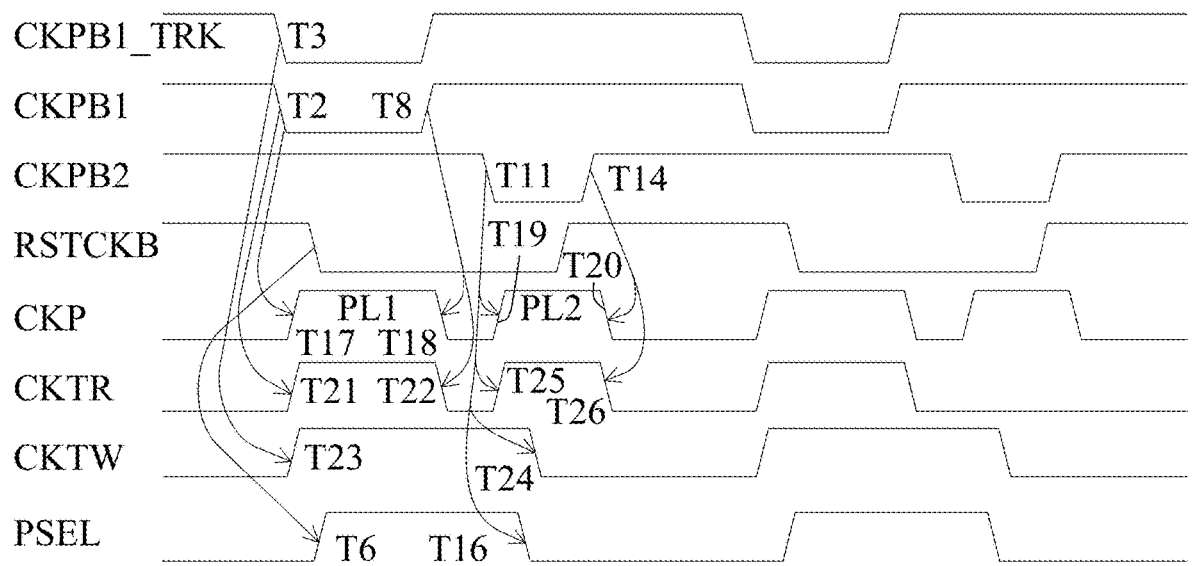

FIGS. 7A and 7B are plots of memory circuit 100 and control circuit 300 operating parameters, in accordance with some embodiments. In the embodiments depicted in FIGS. 7A and 7B, memory circuit 100 is configured to generate clock pulse signal CKTR having the high logical state during write operations, thereby causing latch circuit 130 to latch address WX during write operations. Memory circuit 100 is configured to generate clock pulse signal CKTW having the high logical state, thereby causing latch circuit 110 to also latch address WX, throughout each write operation in the embodiment depicted in FIG. 7A, and for a portion of each write operation in the embodiment depicted in FIG. 7B.

Each of the non-limiting examples depicted in FIGS. 7A and 7B includes signals CKPB1_TRK, CKPB1, CKPB2, RSTCKB, CKP, CKTR, CKTW, and PSEL including transitions T2, T3, T6, T8, T11, T14, and T16-T24, each discussed above with respect to FIGS. 1-4B, and clock pulse signal CKTR including transitions T25 and T26 discussed below. Each of FIGS. 7A and 7B depicts a case in which each of enable signals REB and WEB has a logical state corresponding to an enabled state and is not shown for the purpose of clarity.

In the embodiments depicted in FIGS. 7A and 7B, control circuit 300 is configured to generate transition T25, a rising edge of clock pulse signal CKTR, in response to transition T11, and generate transition T26, a falling edge of clock pulse signal CKTR, in response to transition T14.

In operation, transition 25 causes latch circuit 130 to latch address WX received from selection circuit 120 and output latched address WX to pre-decoder 140 based on the high logical state of selection signal PSEL. Because latch circuit 130 is configured to output latched address WX as long as clock pulse signal CKTR has the high logical state, the logical states of clock pulse signal CKTW and selection signal PSEL between transitions 25 and 26 do not affect latch circuit 130 outputting latched address WX to pre-decoder 140 during pulse PL2 of clock pulse signal CKP.

In contrast to the embodiment depicted in FIGS. 3A-4B, in each of the embodiments depicted in FIGS. 7A and 7B, control circuit 300 is configured to generate transition T16 in select signal PSEL in response to transition T11 in clock pulse signal CKPB2 and after at least one gate delay. Control circuit 300 is thereby configured to generate transition T16 after latch circuit 130 has latched address WX based on transition T25 and before latch circuit 130 no longer outputs latched address WX based on transition T26.

In contrast to the embodiments depicted in FIGS. 3A-4B and 7A, in the embodiment depicted in FIG. 7B, control circuit 300 is configured to generate T24 in clock pulse signal CKTW in response to transition T11 in clock pulse signal CKPB2 and after at least one gate delay. Control circuit 300 is thereby configured to generate transition T24 after latch circuit 130 has latched address WX based on transition T25 and before latch circuit 130 no longer outputs latched address WX based on transition T26.

In the embodiments, depicted in FIGS. 7A and 7B, control circuit 300 is thereby configured to cause latch circuit 130 to output latched address WX to pre-decoder 140 during pulse PL2 of clock pulse signal CKP. In some embodiments, latch circuit 130 outputting latched address WX to pre-decoder 140 during pulse PL2 of clock pulse signal CKP corresponds to a write operation in a memory array, e.g., memory array 160 discussed above with respect to memory circuit 100 and FIGS. 1-2B.

By the configurations discussed above with respect to FIGS. 7A and 7B, control circuit 300 is capable of generating clock pulse signals CKTW, CKTR, and CKP, and select signal PSEL based on clock signal CLK and enable signals REB and WEB having the benefits discussed above with respect to memory circuit 100 and FIGS. 1-2B.

Figure 8:
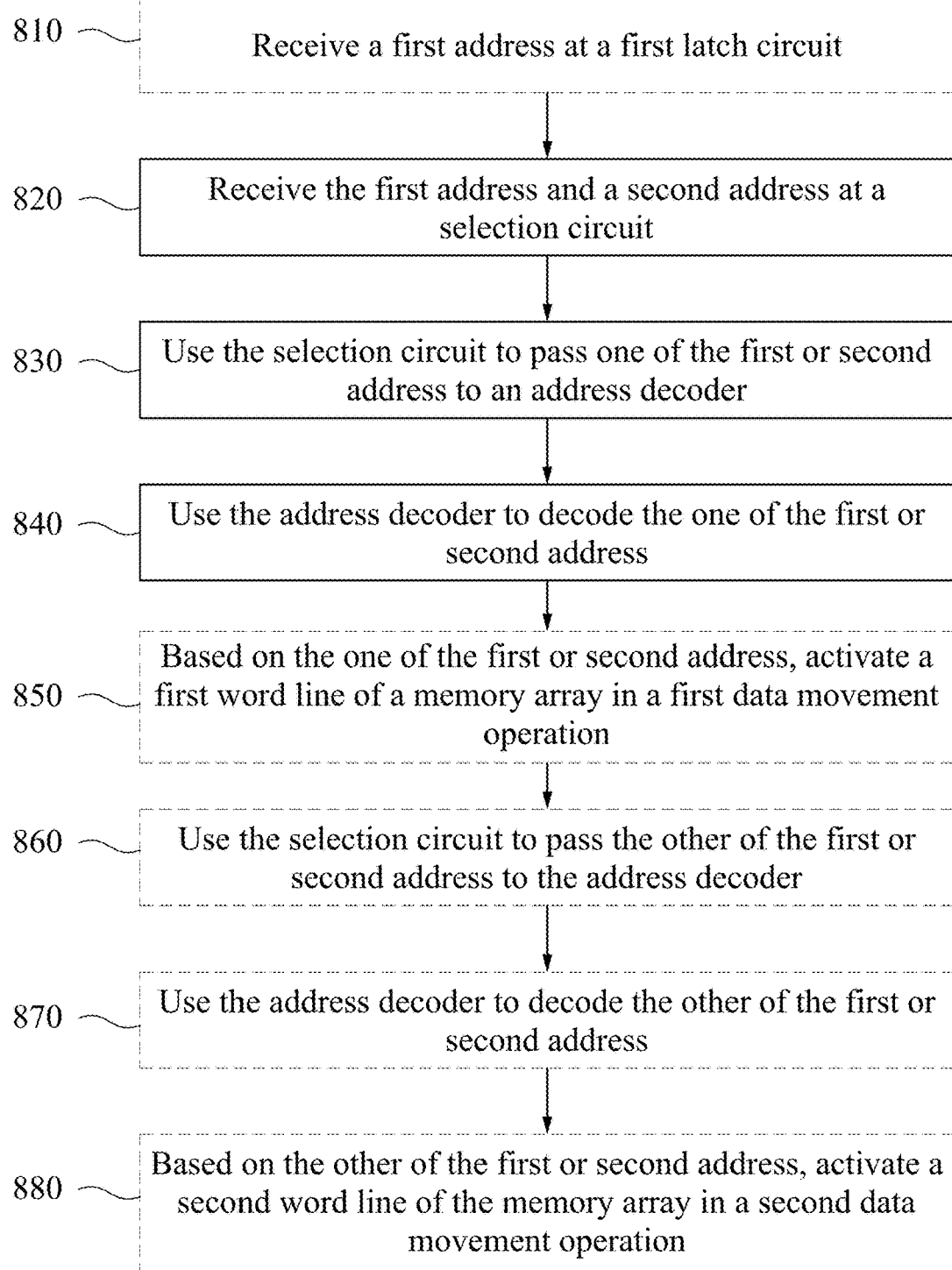
FIG. 8 is a flowchart of a method of operating a memory circuit, in accordance with some embodiments.

FIG. 8 is a flowchart of a method 800 of operating a memory circuit, in accordance with one or more embodiments. Method 800 is usable with a memory circuit, e.g., memory circuit 100 discussed above with respect to FIGS. 1-2B.

The sequence in which the operations of method 800 are depicted in FIG. 8 is for illustration only; the operations of method 800 are capable of being executed in sequences that differ from that depicted in FIG. 8. In some embodiments, operations in addition to those depicted in FIG. 8 are performed before, between, during, and/or after the operations depicted in FIG. 8.

In some embodiments, some or all of the operations of method 800 are a subset of register data movement operations, e.g., pseudo 2PRF operations as discussed above, in a processor.

At operation 810, in some embodiments, a first address is received at a first latch circuit of the memory circuit. The first address includes information configured to identify one or more locations in a memory array. In some embodiments, the one or more locations correspond to a data word. In some embodiments, the one or more locations correspond to a position, e.g., an X position, within a column of the memory array.

In some embodiments, the memory array includes a register file including a plurality of processor registers, and the first address corresponds to a processor register. In various embodiments, the memory array is included in the memory circuit or separate from the memory circuit.

In some embodiments, receiving the first address includes receiving the first address from a first data port coupled to the memory circuit. In some embodiments, receiving the first address includes receiving the first address as part of performing a data movement operation in the memory array. In some embodiments, receiving the first address includes receiving a write address as part of performing a write operation in the memory array.

In some embodiments, receiving the first address at the first latch circuit includes receiving a control signal at the first latch circuit and responding to the control signal by latching the first address. In some embodiments, receiving the control signal includes generating the control signal using a control circuit. In some embodiments, generating the control signal includes generating the control signal in response to a clock signal and one or more enable signals.

In some embodiments, the first address is address WX, and/or the first latch circuit is latch circuit 110, and/or the memory array is memory array 160, each discussed above with respect to memory circuit 100 and FIGS. 1-2B. In some embodiments, generating and/or receiving the control signal includes generating and/or receiving clock pulse signal CKTW discussed above with respect to memory circuit 100, control circuits 170 and 300, and FIGS. 1-4B, 7A, and 7B.

At operation 820, the first address and a second address are received at a selection circuit. The second address is a same type of address as the first address discussed above. In some embodiments, receiving the first and second addresses includes receiving one or both of the first or second address from a latch circuit, e.g., the first latch circuit.

In some embodiments, receiving the second address includes receiving the second address from a second data port coupled to the memory circuit. In some embodiments, receiving the second address includes receiving the first address as part of performing a data movement operation in the memory array. In some embodiments, receiving the second address includes receiving a read address as part of performing a read operation in the memory array.

In some embodiments, receiving the first and second addresses includes receiving the first and second addresses at a multiplexer. In some embodiments, receiving the first and second addresses includes receiving addresses RX and WX at selection circuit 120, discussed above with respect to memory circuit 100 and FIGS. 1-2B.

At operation 830, the selection circuit is used to pass one of the first or second address to an address decoder. In some embodiments, using the selection circuit to pass the one of the first or second address to the address decoder includes using a multiplexer.

In some embodiments, using the selection circuit to pass the one of the first or second address to the address decoder includes receiving a control signal at the selection circuit and responding to the control signal by selecting the one of the first or second address. In some embodiments, receiving the control signal includes generating the control signal using a control circuit. In some embodiments, generating the control signal includes generating the control signal in response to a clock signal and one or more enable signals.

In some embodiments, the first and second addresses are address WX and RX, and/or the selection circuit is selection circuit 120, and/or the address decoder is decoder 150, each discussed above with respect to memory circuit 100 and FIGS. 1-2B. In some embodiments, generating and/or receiving the control signal includes generating and/or receiving select signal PSEL discussed above with respect to memory circuit 100, control circuits 170 and 300, signal generation circuit 600, and FIGS. 1-4B and 6-7B.

In some embodiments, using the selection circuit to pass the one of the first or second address to the address decoder includes receiving the one of the first or the second address from the selection circuit at a latch circuit, e.g., a second latch circuit. In some embodiments, using the selection circuit to pass the one of the first or second address to the address decoder includes receiving the one of the first or the second address at latch circuit 130 discussed above with respect to memory circuit 100 and FIGS. 1-2B.

In some embodiments, receiving the one of the first or the second address at the second latch circuit includes receiving a control signal at the second latch circuit and responding to the control signal by latching the one of the first or second address. In some embodiments, receiving the control signal includes generating the control signal using a control circuit. In some embodiments, generating the control signal includes generating the control signal in response to a clock signal and one or more enable signals.

In some embodiments, the one of the first or second address is one of addresses WX or RX, and/or the second latch circuit is latch circuit 130, each discussed above with respect to memory circuit 100 and FIGS. 1-2B. In some embodiments, generating and/or receiving the control signal includes generating and/or receiving clock pulse signal CKTR discussed above with respect to memory circuit 100, control circuits 170 and 300, and FIGS. 1-4B, 7A, and 7B.

In some embodiments, using the selection circuit to pass the one of the first or second address to the address decoder includes receiving the one of the first or the second address from the selection circuit at a pre-decoder. In some embodiments, using the selection circuit to pass the one of the first or second address to the address decoder includes receiving the one of the first or the second address at pre-decoder 140 discussed above with respect to memory circuit 100 and FIGS. 1-2B.

At operation 840, the address decoder is used to decode the one of the first or second addresses passed by the selection circuit. In some embodiments, using the address decoder includes using a pre-decoder, e.g., pre-decoder 140 discussed above with respect to memory circuit 100 and FIGS. 1-2B.

In some embodiments, using the address decoder to decode the one of the first or second address includes receiving a control signal at the pre-decoder and/or address decoder and responding to the control signal by pre-decoding and/or decoding the one of the first or second address. In some embodiments, receiving the control signal includes generating the control signal using a control circuit. In some embodiments, generating the control signal includes generating the control signal in response to a clock signal and one or more enable signals.

In some embodiments, the one of the first or second address is one of addresses WX or RX, and/or the decoder is decoder 150, each discussed above with respect to memory circuit 100 and FIGS. 1-2B. In some embodiments, generating and/or receiving the control signal includes generating and/or receiving clock pulse signal CKP discussed above with respect to memory circuit 100, control circuits 170 and 300, and FIGS. 1-4B, 7A, and 7B.

At operation 850, in some embodiments, based on the one of the first or second address, a first word line of a memory array is activated in a first data movement operation. Activating the first word line includes using the decoder, e.g., decoder 150 discussed above with respect to memory circuit 100 and FIGS. 1-2B. In some embodiments, activating the first word line includes using one or more circuits, e.g., logic gates, between the decoder and the first word line. In various embodiments, the first data movement operation is a read operation or a write operation in the memory array.

In various embodiments, activating the first word line of the memory array includes activating the first word line of the memory array included in the memory circuit or separate from the memory circuit. In some embodiments, activating the first word line includes activating one or more memory cells of the memory array. In some embodiments, activating the first word line includes activating a word line of memory array 160 discussed above with respect to memory circuit 100 and FIGS. 1-2B.

In some embodiments, activating the first word line includes generating one of word line signals WL[1]-WL[N] on a corresponding one of word line signal paths WP[1]-WP[N] discussed above with respect to memory circuit 100 and FIGS. 1-2B.

At operation 860, in some embodiments, the selection circuit is used to pass the other of the first or second address to the address decoder. Using the selection circuit to pass the other of the first or second address to the address decoder is performed in the same manner as using the selection circuit to pass the one of the first or second address to the address decoder discussed above with respect to operation 830.

At operation 870, in some embodiments, the address decoder is used to decode the other of the first or second address. Using the decoder to decode the other of the first or second address is performed in the same manner as using the decoder to decode the one of the first or second address discussed above with respect to operation 840.

At operation 880, in some embodiments, based on the other of the first or second address, a second word line of the memory array is activated in a write operation. Activating the second word line of the memory array is performed in the same manner as activating the first word line of the memory array discussed above with respect to operation 850.

In some embodiments, operations 830 through 880 are performed using self-timed control signals, e.g., clock pulse signals CKTW, CHTR, and CKP, and select signal PSEL discussed above with respect to memory circuit 100, control circuits 170 and 300, signal generation circuits 500 and 600, and FIGS. 1-7B. In some embodiments, operations 830 through 880 are performed within a single period of a clock signal, e.g., clock signal CLK discussed above with respect to memory circuit 100, control circuits 170 and 300, signal generation circuits 500 and 600, and FIGS. 1-7B.

By executing some or all of the operations of method 800, a memory circuit is used to perform a data movement operation based on a selected one of two received addresses, thereby obtaining the benefits discussed above with respect to memory circuit 100, control circuit 300, and signal generation circuit 600.

In some embodiments, a circuit includes a plurality of registers, each register including SRAM cells, a read port configured to receive a read address, a write port configured to receive a write address, a selection circuit, a latch circuit, and a decoder coupled in series between the read and write ports and the plurality of registers, and a control circuit configured to, responsive to a clock signal and read and write enable signals, cause the selection circuit, the latch circuit, and the decoder to select a first register of the plurality of registers in a read operation based on the read address, and select a second register of the plurality of registers in a write operation based on the write address. In some embodiments, the read port includes a number L of electrical paths corresponding to the number L of logical states of the read address, the write port includes the number L of electrical paths corresponding to the number L of logical states of the write address, and a number N of registers of the plurality of registers is equal to 2L. In some embodiments, the plurality of registers is coupled to the decoder through a plurality of the number N of signal lines. In some embodiments, the circuit includes a pre-decoder coupled between the latch circuit and the decoder, and each of the selection circuit, the latch circuit, and the pre-decoder includes the number L of electrical paths. In some embodiments, the control circuit includes first and second latch circuits configured to latch the read and write enable signals responsive to the clock signal, and the control circuit is configured to output a plurality of control signals to the selection circuit and the latch circuit based on the latched read and write enable signals. In some embodiments, the clock signal has a period corresponding to rising edges of the clock signal, and the control circuit is configured to cause the selection circuit, the latch circuit, and the decoder to select the first register of the plurality of registers in the read operation during a first portion of the period, and cause the selection circuit, the latch circuit, and the decoder to select the second register of the plurality of registers in the write operation during a second portion of the period subsequent to the first portion. In some embodiments, the control circuit is configured to cause the selection circuit, the latch circuit, and the decoder to select the first register of the plurality of registers in the read operation responsive to a logical state of the read enable signal at a start of the period, and cause the selection circuit, the latch circuit, and the decoder to select the second register of the plurality of registers in the write operation responsive to a logical state of the write enable signal at the start of the period. In some embodiments, the registers of the plurality of registers include processor registers, and the circuit is configured to control data movement in pseudo 2PRF operations.

In some embodiments, a circuit includes a plurality of registers, each register including SRAM cells, a read port configured to receive a read address, a write port configured to receive a write address, a first latch circuit, a selection circuit, a second latch circuit, and a decoder coupled in series between the read and write ports and the plurality of registers, and a control circuit configured to, responsive to a clock signal and read and write enable signals, cause the first latch circuit, the selection circuit, the second latch circuit, and the decoder to select a first register of the plurality of registers in a read operation based on the read address, and select a second register of the plurality of registers in a write operation based on the write address. In some embodiments, the first latch circuit and the selection circuit are coupled in series between the write port and the second latch circuit, and the selection circuit is directly coupled to each of the read port and the second latch circuit. In some embodiments, each of the read and write addresses includes a number L of logical states, each of the read and write ports includes the number L of electrical paths, the plurality of registers includes a number N of registers coupled to the decoder through a plurality of the number N of signal lines, and the number N is equal to 2L. In some embodiments, the circuit includes a pre-decoder coupled between the latch circuit and the decoder, and each of the first latch circuit, the selection circuit, the second latch circuit, and the pre-decoder includes the number L of electrical paths. In some embodiments, the control circuit includes first and second latch circuits configured to latch the read and write enable signals responsive to a rising edge of the clock signal, wherein the control circuit is configured to cause the first latch circuit, the selection circuit, the second latch circuit, and the decoder to select the first register of the plurality of registers in the read operation responsive to a logical state of the latched read enable signal, and cause the first latch circuit, the selection circuit, the second latch circuit, and the decoder to select the second register of the plurality of registers in the write operation responsive to a logical state of the latched write enable signal. In some embodiments, a start of a clock signal period corresponds to the rising edge of the clock signal, and the control circuit is configured to cause the selection circuit, the latch circuit, and the decoder to select the first register of the plurality of registers in the read operation during a first portion of the clock signal period, and cause the selection circuit, the latch circuit, and the decoder to select the second register of the plurality of registers in the write operation during a second portion of the clock signal period subsequent to the first portion.

In some embodiments, a method of operating a memory circuit includes receiving a read address at a read port of the memory circuit, receiving a write address at a write port of the memory circuit, receiving a clock signal and read and write enable signals at a control circuit of the memory circuit, and in response to the clock signal and read and write enable signals, using the control circuit to cause a selection circuit, a latch circuit, and a decoder to select a first register of a plurality of registers in a read operation based on the read address, and select a second register of the plurality of registers in a write operation based on the write address. Each register includes SRAM cells, and the selection circuit, the latch circuit, and the decoder are coupled in series between the read and write ports and the plurality of registers. In some embodiments, receiving the read address at the read port includes receiving a number L of logical states of the read address on the number L of electrical paths of the read port, receiving the write address at the write port includes receiving the number L of logical states of the write address on the number L of electrical paths of the write port, each of the selecting the first and second registers of the plurality of registers includes activating a signal line of a plurality of the number N of signal lines, and the number N is equal to $2^L$. In some embodiments, selecting the first register of the plurality of registers in the read operation includes partially decoding the read address using a pre-decoder comprising the number L of electrical paths, and selecting the second register of the plurality of registers in the write operation include partially decoding the write address using the pre-decoder. In some embodiments, receiving the clock signal and read and write enable signals at the control circuit includes latching the read and write enable signals responsive to a rising edge of the clock signal, using the control circuit to cause the selection circuit, the latch circuit, and the decoder to select the first register of the plurality of registers in the read operation is in response to a logical state of the latched read enable signal, and using the control circuit to cause the selection circuit, the latch circuit, and the decoder to select the second register of the plurality of registers in the write operation is in response to a logical state of the latched write enable signal. In some embodiments, a start of a clock signal period corresponds to the rising edge of the clock signal, using the control circuit to cause the selection circuit, the latch circuit, and the decoder to select the first register of the plurality of registers in the read operation includes selecting the first register during a first portion of the clock signal period, and using the control circuit to cause the selection circuit, the latch circuit, and the decoder to select the second register of the plurality of registers in the write operation includes selecting the second register during a second portion of the clock signal period subsequent to the first portion. In some embodiments, each of selecting the first register of the plurality of registers in the read operation and selecting the second register of the plurality of registers in the write operation includes controlling data movement in pseudo 2PRF operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
a plurality of registers, each register comprising static random access memory (SRAM) cells;
a read port configured to receive a read address;
a write port configured to receive a write address;
a selection circuit, a latch circuit, and a decoder coupled in series between the read and write ports and the plurality of registers; and
a control circuit configured to, responsive to a clock signal and read and write enable signals, cause the selection circuit, the latch circuit, and the decoder to:
select a first register of the plurality of registers in a read operation based on the read address, and
select a second register of the plurality of registers in a write operation based on the write address.

2. The circuit of claim 1, wherein
the read port comprises a number L of electrical paths corresponding to the number L of logical states of the read address,
the write port comprises the number L of electrical paths corresponding to the number L of logical states of the write address, and
a number N of registers of the plurality of registers is equal to $2^L$.

3. The circuit of claim 2, wherein the plurality of registers is coupled to the decoder through a plurality of the number N of signal lines.

4. The circuit of claim 2, further comprising:
a pre-decoder coupled between the latch circuit and the decoder,
wherein each of the selection circuit, the latch circuit, and the pre-decoder comprises the number L of electrical paths.

5. The circuit of claim 1, wherein the control circuit comprises:
first and second latch circuits configured to latch the read and write enable signals responsive to the clock signal,
wherein the control circuit is configured to output a plurality of control signals to the selection circuit and the latch circuit based on the latched read and write enable signals.

6. The circuit of claim 1, wherein
the clock signal has a period corresponding to rising edges of the clock signal, and
the control circuit is configured to
cause the selection circuit, the latch circuit, and the decoder to select the first register of the plurality of registers in the read operation during a first portion of the period, and cause the selection circuit, the latch circuit, and the decoder to select the second register of the plurality of registers in the write operation during a second portion of the period subsequent to the first portion.

7. The circuit of claim 6, wherein the control circuit is configured to
cause the selection circuit, the latch circuit, and the decoder to select the first register of the plurality of registers in the read operation responsive to a logical state of the read enable signal at a start of the period, and
cause the selection circuit, the latch circuit, and the decoder to select the second register of the plurality of registers in the write operation responsive to a logical state of the write enable signal at the start of the period.

8. The circuit of claim 1, wherein
the registers of the plurality of registers comprise processor registers, and
the circuit is configured to control data movement in pseudo two-port register file (2PRF) operations.

9. A circuit comprising:
a plurality of registers, each register comprising static random access memory (SRAM) cells;
a read port configured to receive a read address;
a write port configured to receive a write address;
a first latch circuit, a selection circuit, a second latch circuit, and a decoder coupled in series between the read and write ports and the plurality of registers; and
a control circuit configured to, responsive to a clock signal and read and write enable signals, cause the first latch circuit, the selection circuit, the second latch circuit, and the decoder to:
select a first register of the plurality of registers in a read operation based on the read address, and
select a second register of the plurality of registers in a write operation based on the write address.

10. The circuit of claim 9, wherein
the first latch circuit and the selection circuit are coupled in series between the write port and the second latch circuit, and
the selection circuit is directly coupled to each of the read port and the second latch circuit.

11. The circuit of claim 9, wherein
each of the read and write addresses comprises a number L of logical states,
each of the read and write ports comprises the number L of electrical paths,
the plurality of registers comprises a number N of registers coupled to the decoder through a plurality of the number N of signal lines, and
the number N is equal to $2^L$.

12. The circuit of claim 11, further comprising:
a pre-decoder coupled between the second latch circuit and the decoder,
wherein each of the first latch circuit, the selection circuit, the second latch circuit, and the pre-decoder comprises the number L of electrical paths.

13. The circuit of claim 9, wherein the control circuit comprises:
third and fourth latch circuits configured to latch the read and write enable signals responsive to a rising edge of the clock signal, wherein the control circuit is configured to
cause the first latch circuit, the selection circuit, the second latch circuit, and the decoder to select the first register of the plurality of registers in the read operation responsive to a logical state of the latched read enable signal, and cause the first latch circuit, the selection circuit, the second latch circuit, and the decoder to select the second register of the plurality of registers in the write operation responsive to a logical state of the latched write enable signal.

14. The circuit of claim 13, wherein a start of a clock signal period corresponds to the rising edge of the clock signal, and the control circuit is configured to cause the first latch circuit, the selection circuit, the second latch circuit, and the decoder to select the first register of the plurality of registers in the read operation during a first portion of the clock signal period, and cause the first latch circuit, the selection circuit, the second latch circuit, and the decoder to select the second register of the plurality of registers in the write operation during a second portion of the clock signal period subsequent to the first portion.

15. A method of operating a memory circuit, the method comprising:

receiving a read address at a read port of the memory circuit;

receiving a write address at a write port of the memory circuit;

receiving a clock signal and read and write enable signals at a control circuit of the memory circuit; and in response to the clock signal and read and write enable signals, using the control circuit to cause a selection circuit, a latch circuit, and a decoder to:

select a first register of a plurality of registers in a read operation based on the read address, and select a second register of the plurality of registers in a write operation based on the write address, wherein each register comprises static random access memory (SRAM) cells, and the selection circuit, the latch circuit, and the decoder are coupled in series between the read and write ports and the plurality of registers.

16. The method of claim 15, wherein the receiving the read address at the read port comprises receiving a number L of logical states of the read address on the number L of electrical paths of the read port, the receiving the write address at the write port comprises receiving the number L of logical states of the write address on the number L of electrical paths of the write port, each of the selecting the first and second registers of the plurality of registers comprises activating a signal line of a plurality of the number N of signal lines, and the number N is equal to $2^L$.

17. The method of claim 16, wherein the selecting the first register of the plurality of registers in the read operation comprises partially decoding the read address using a pre-decoder comprising the number L of electrical paths, and the selecting the second register of the plurality of registers in the write operation comprises partially decoding the write address using the pre-decoder.

18. The method of claim 15, wherein the receiving the clock signal and read and write enable signals at the control circuit comprises latching the read and write enable signals responsive to a rising edge of the clock signal, the using the control circuit to cause the selection circuit, the latch circuit, and the decoder to select the first register of the plurality of registers in the read operation is in response to a logical state of the latched read enable signal, and the using the control circuit to cause the selection circuit, the latch circuit, and the decoder to select the second register of the plurality of registers in the write operation is in response to a logical state of the latched write enable signal.

19. The method of claim 18, wherein a start of a clock signal period corresponds to the rising edge of the clock signal, the using the control circuit to cause the selection circuit, the latch circuit, and the decoder to select the first register of the plurality of registers in the read operation comprises selecting the first register during a first portion of the clock signal period, and the using the control circuit to cause the selection circuit, the latch circuit, and the decoder to select the second register of the plurality of registers in the write operation comprises selecting the second register during a second portion of the clock signal period subsequent to the first portion.

20. The method of claim 15, wherein each of the selecting the first register of the plurality of registers in the read operation and the selecting the second register of the plurality of registers in the write operation comprises controlling data movement in pseudo two-port register file (2PRF) operations.

* * * * *